US009058886B2

(12) United States Patent
Miyakawa

(10) Patent No.: US 9,058,886 B2
(45) Date of Patent: Jun. 16, 2015

(54) POWER SUPPLY CIRCUIT AND PROTECTION CIRCUIT

(71) Applicant: KABUSHIKI KAISHA TOSHIBA, Minato-ku, Tokyo (JP)

(72) Inventor: Tadashi Miyakawa, Yokohama (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 149 days.

(21) Appl. No.: 13/966,151

(22) Filed: Aug. 13, 2013

(65) Prior Publication Data

US 2014/0286085 A1 Sep. 25, 2014

Related U.S. Application Data

(60) Provisional application No. 61/804,580, filed on Mar. 22, 113.

(51) Int. Cl.
G11C 5/14 (2006.01)
G11C 11/16 (2006.01)
H02H 3/20 (2006.01)

(52) U.S. Cl.
CPC ............ *G11C 11/1695* (2013.01); *H02H 3/20* (2013.01); *G11C 5/147* (2013.01)

(58) Field of Classification Search
USPC ......... 365/226, 189.011, 189.06, 189.07, 227
See application file for complete search history.

(56) References Cited

U.S. PATENT DOCUMENTS

| 6,876,180 | B2 * | 4/2005 | Suzuki et al. ............... 323/270 |
| 7,230,806 | B2 * | 6/2007 | Poon et al. ................... 361/56 |
| 8,094,422 | B2 * | 1/2012 | Sasaki ........................... 361/56 |
| 8,164,872 | B2 * | 4/2012 | Suzuki .......................... 361/56 |
| 2002/0130366 | A1 | 9/2002 | Morishita | |

FOREIGN PATENT DOCUMENTS

| JP | 2006-001341 A | 1/2006 |
| JP | 2007-294765 A | 11/2007 |

OTHER PUBLICATIONS

H.G. Feng et al.; "On-Chip ESD Protection Design for Ics"; Integrated Electronics Laboratory, Dept. of Electrical & Computer Engineering, Illinois Institute of Technology; Chicago, IL.

* cited by examiner

*Primary Examiner* — Pho M Luu
(74) *Attorney, Agent, or Firm* — Holtz, Holtz, Goodman & Chick PC

(57) ABSTRACT

A power supply circuit includes a first circuit connected to a first line, to which a power supply voltage is applied, and a second line, and a power supply clamp circuit connected to the first and second lines. The power supply clamp circuit includes a current path circuit which connects the first and the second lines to each other, and a control circuit which outputs a control signal to the current path circuit. The current path circuit includes a transistor and a diode group. The power supply clamp circuit is driven during a period in which a first voltage is applied to the first line and controls a potential of the first line so as to become a potential lower than the first voltage.

18 Claims, 15 Drawing Sheets

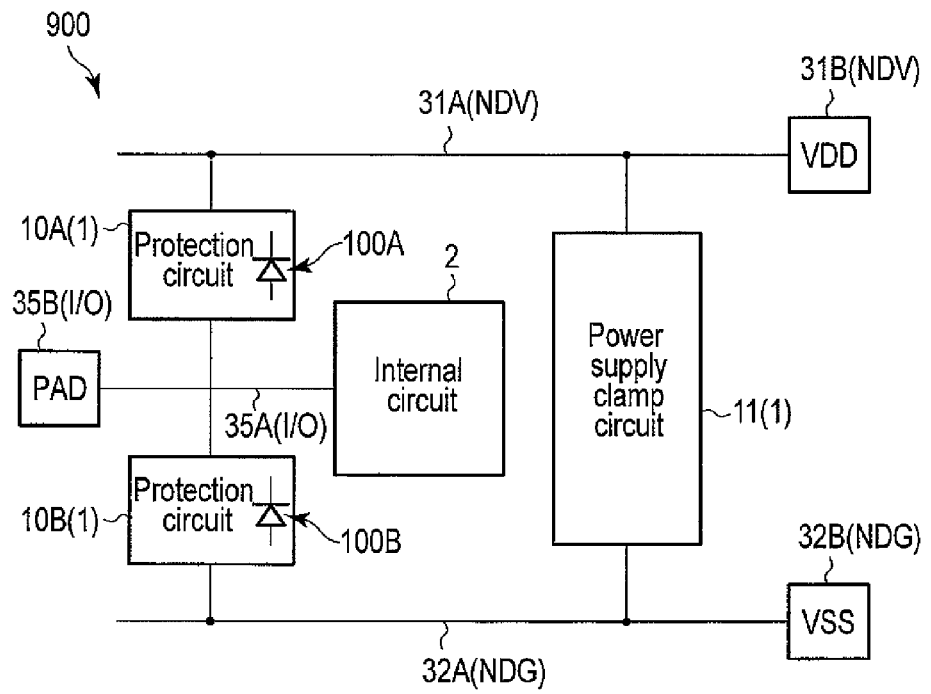
F I G. 1
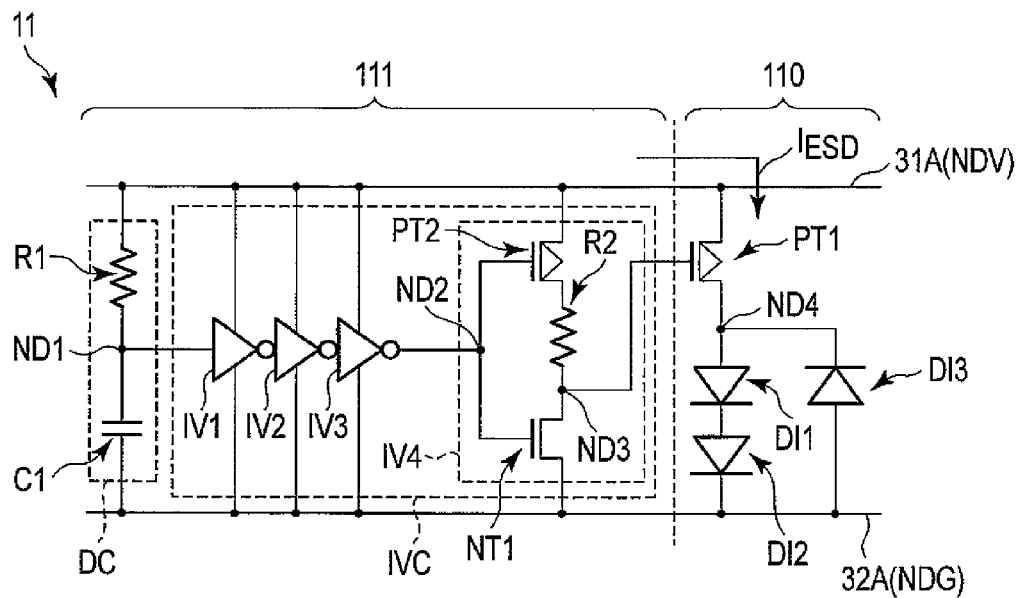
F I G. 2

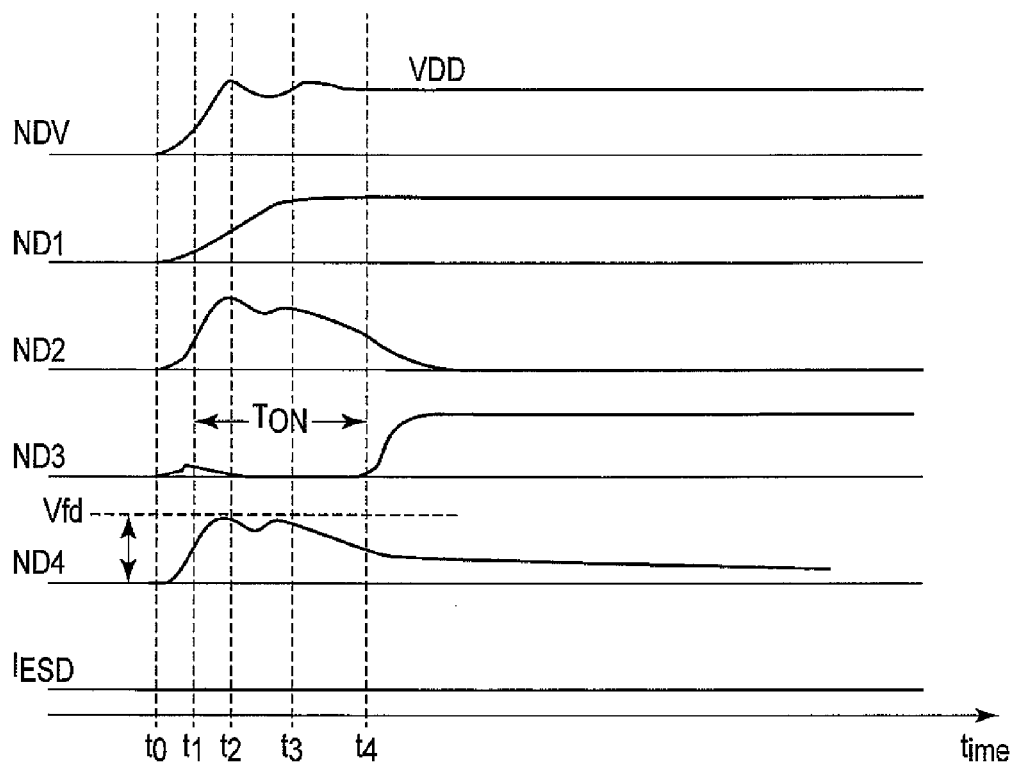
F I G. 5
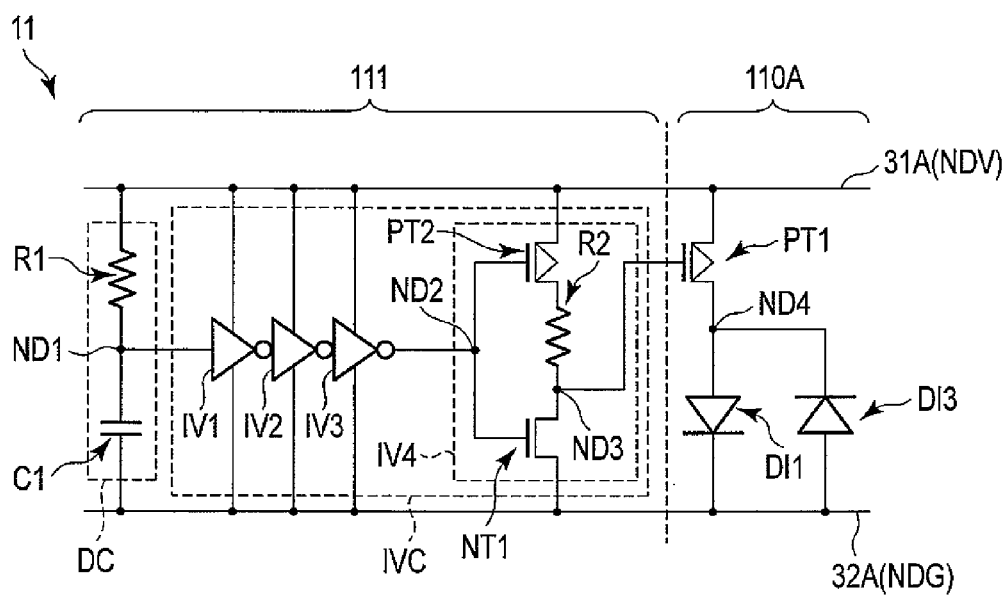
F I G. 6

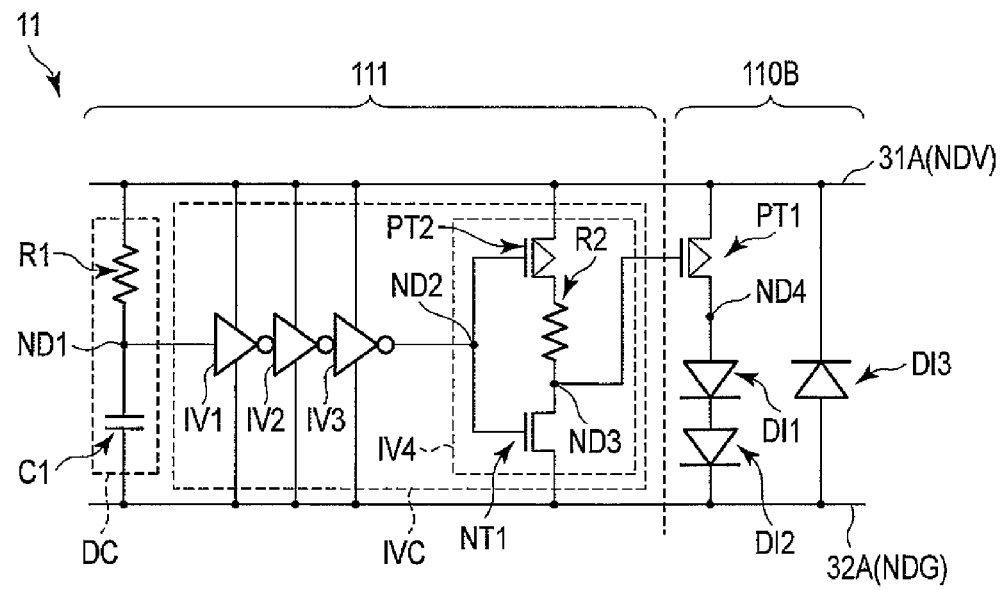
F I G. 7
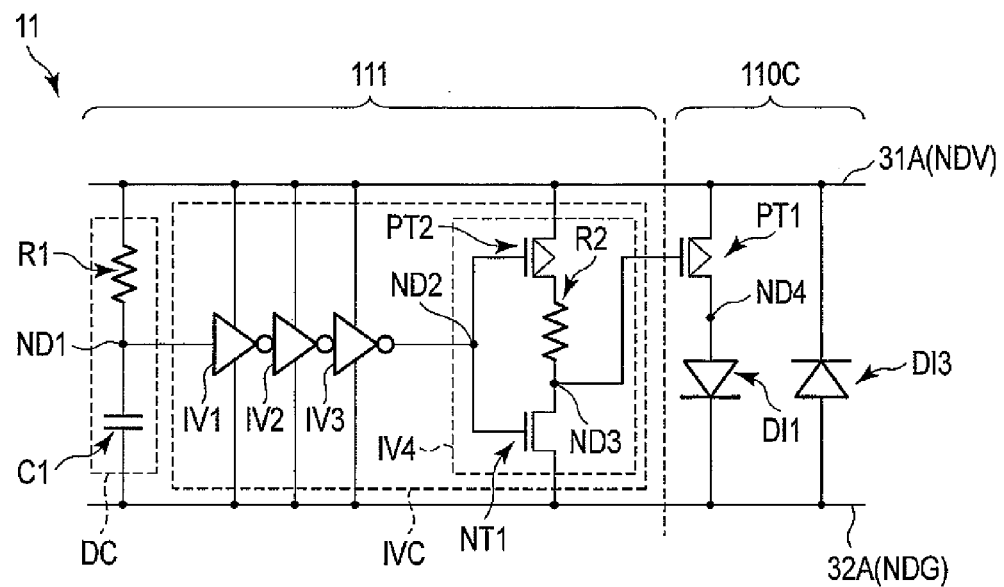
F I G. 8

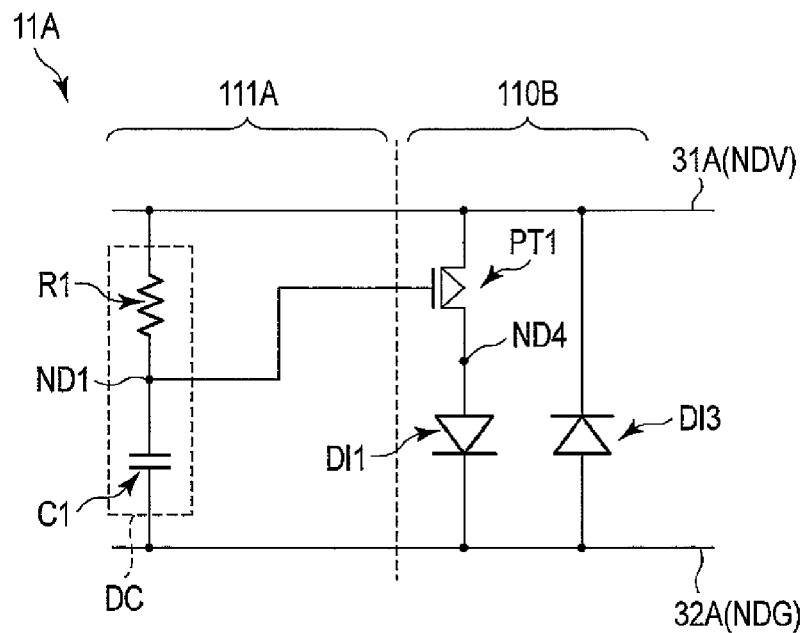
F I G. 15
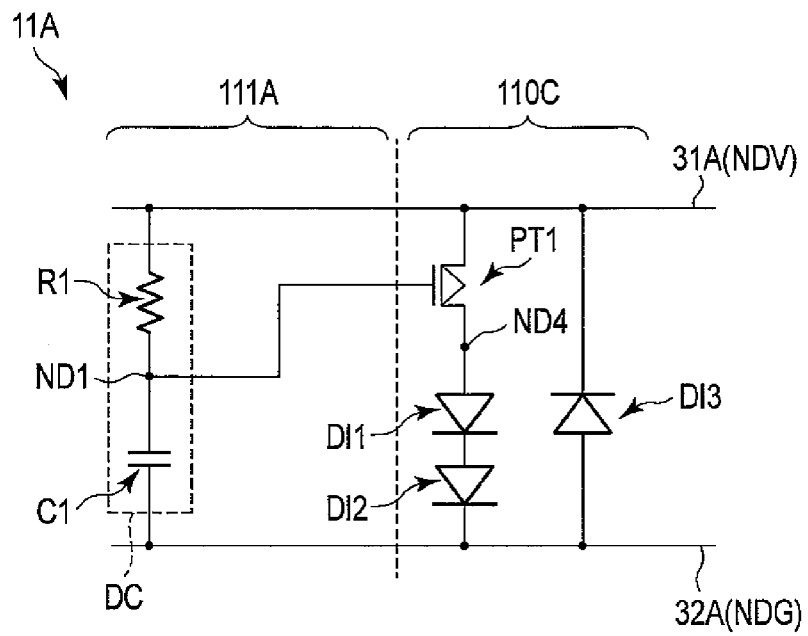
F I G. 16

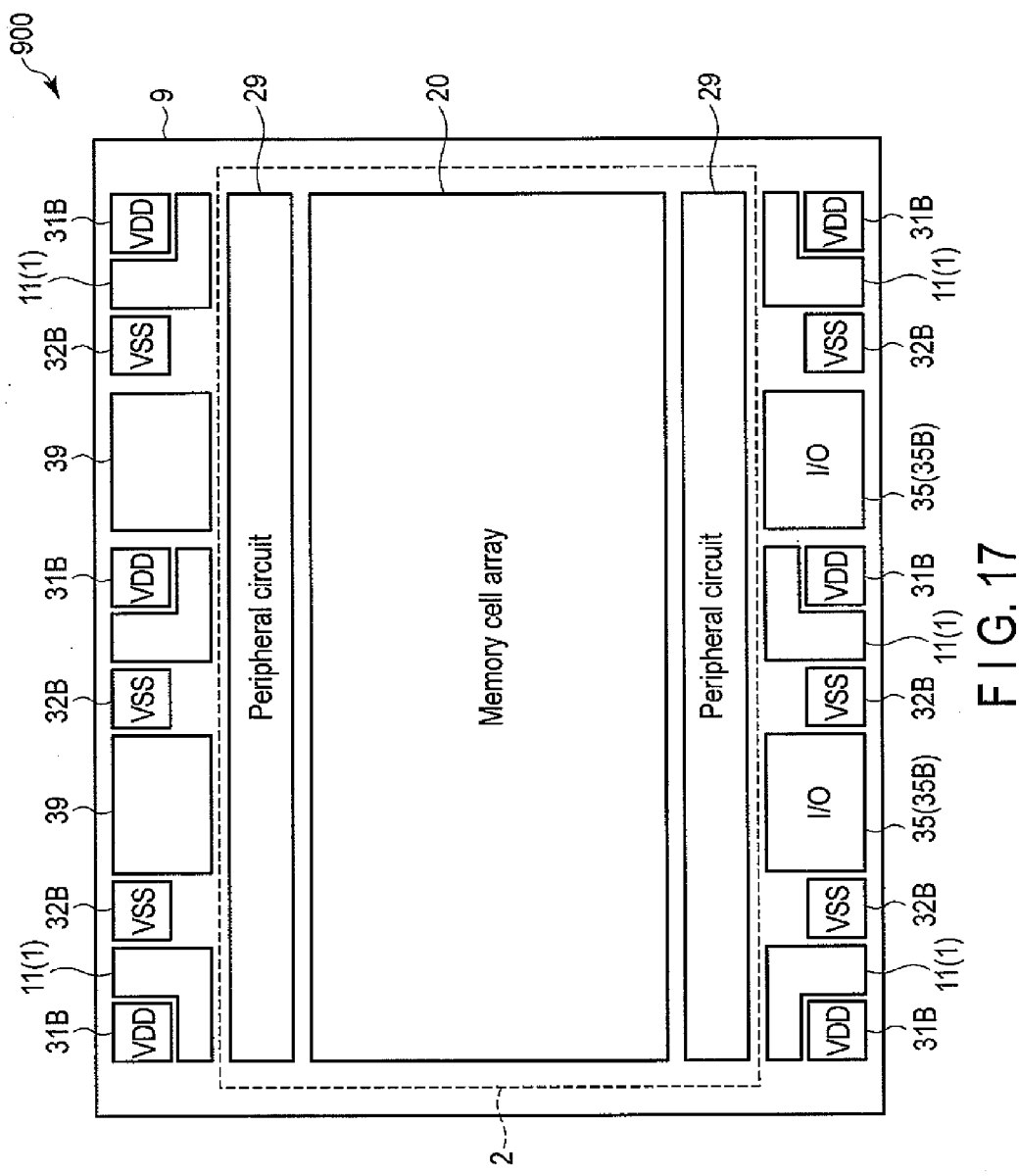
F I G. 17

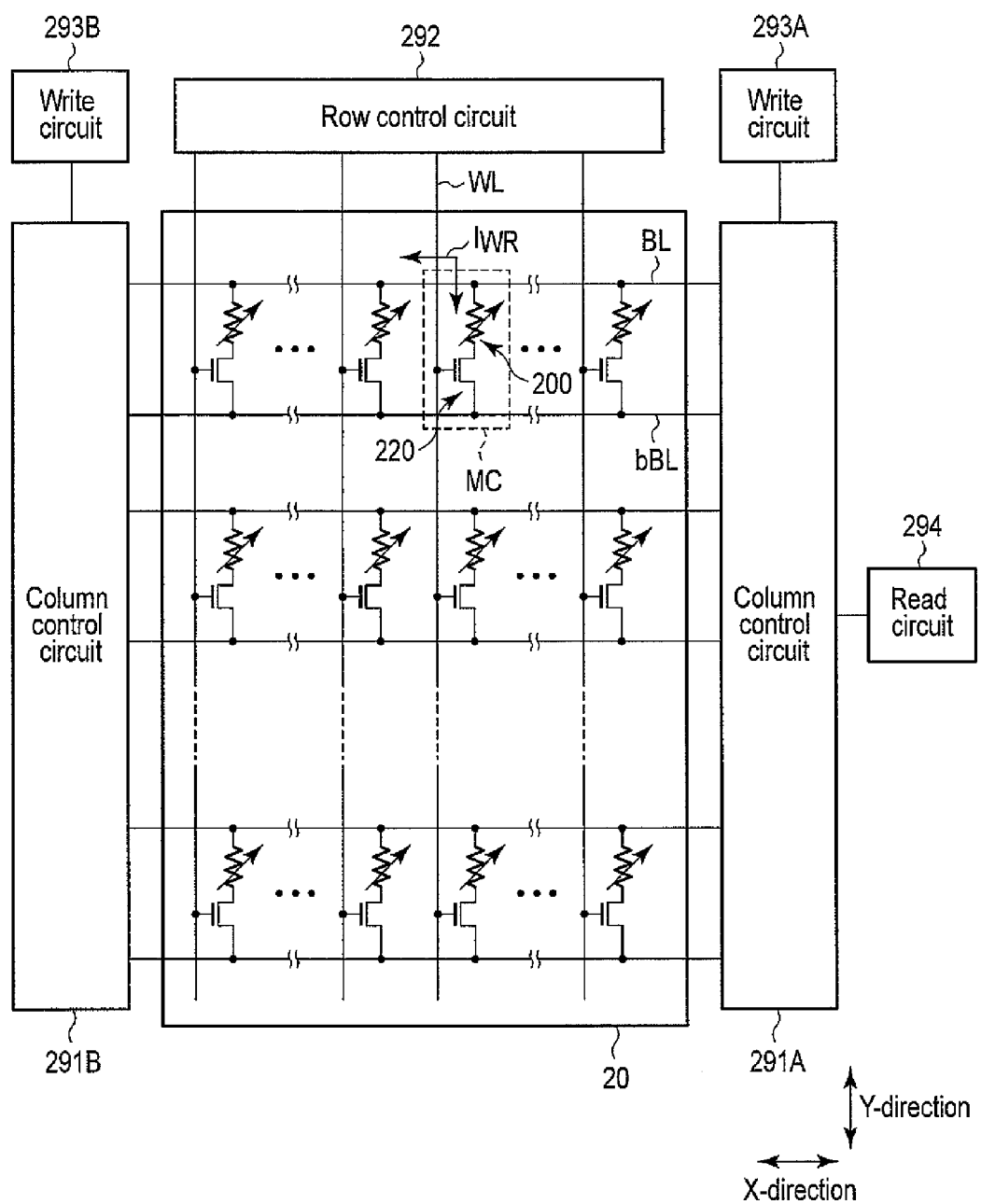
F I G. 18

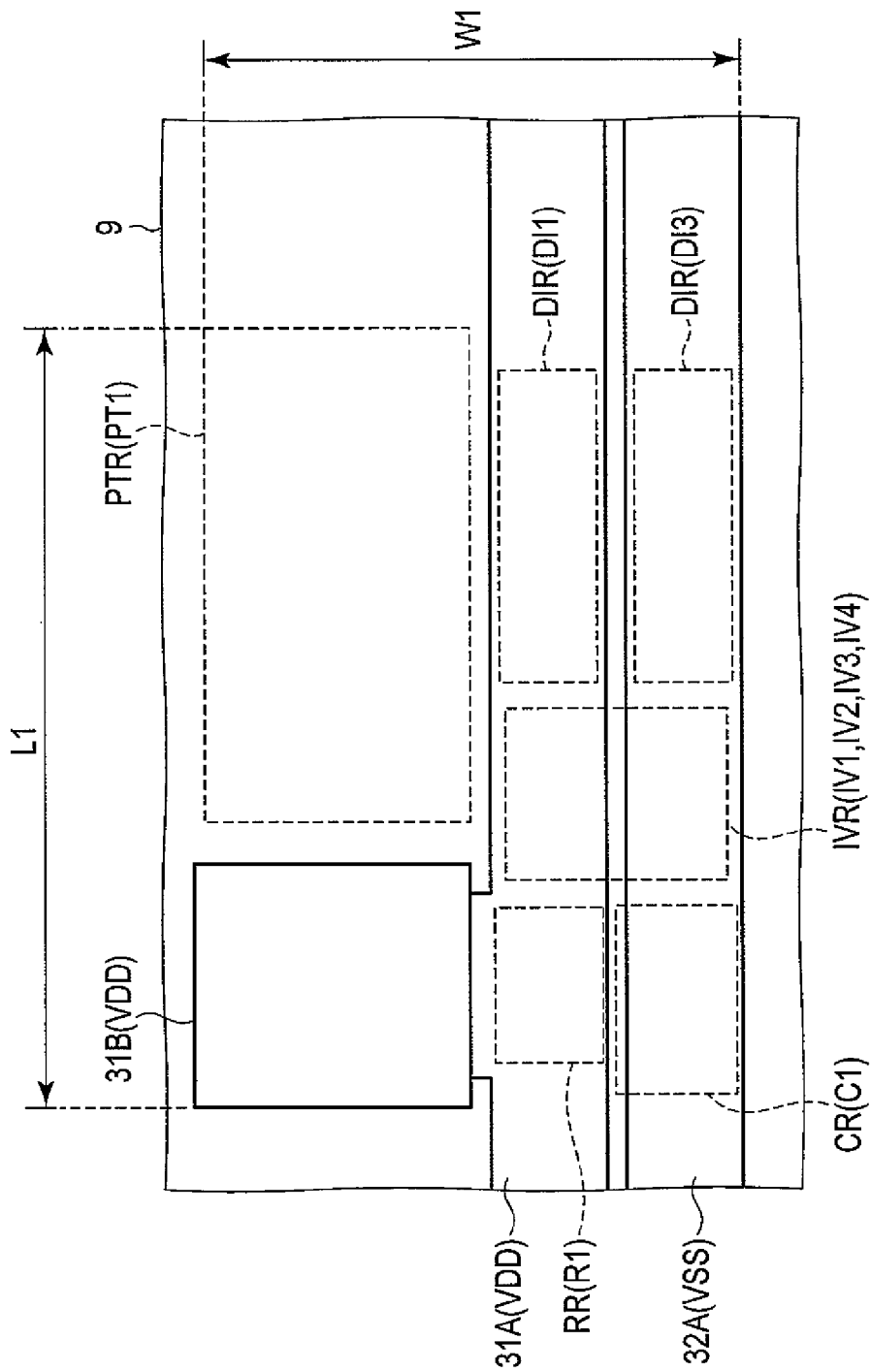
F I G. 19

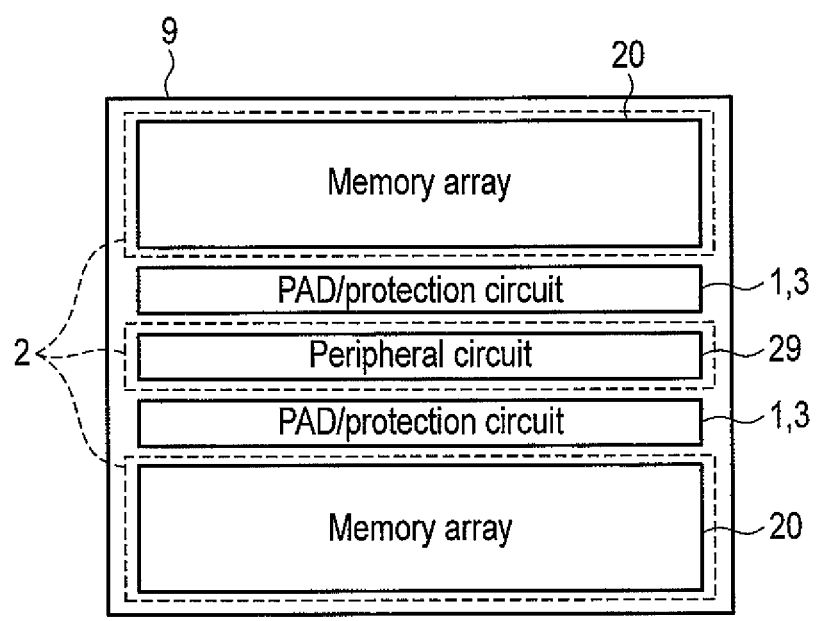
F I G. 24

POWER SUPPLY CIRCUIT AND PROTECTION CIRCUIT

CROSS-REFERENCE TO RELATED APPLICATIONS

This application claims the benefit of U.S. Provisional Application No. 61/804,580, filed Mar. 22, 2013, the entire contents of which are incorporated herein by reference.

FIELD

Embodiments described herein relate generally to a power supply circuit and a protection circuit.

BACKGROUND

One of reliability test items of semiconductor devices is an Electro-Static Discharge (ESD) destruction test. Semiconductor devices are guaranteed for electrostatic discharge resistance of a predetermined voltage or higher so as to be resistant to electrostatic discharges of, for example, HBM (Human Body Model), MM (Machine Model), and CDM (Charged Device Model).

The trend in semiconductor devices used for mobile terminals, etc. involves a proceeding toward thin filming of an oxide film of a MOS transistor in a periphery circuit in order to meet the demand of low power consumption, low voltage, and fast speed. Since the destruction voltage resistance of a gate insulating film (oxide film) of a transistor is decreasing in association with this trend, it is demanded to develop an ESD protection circuit operating at a low voltage and a power supply circuit including such an ESD protection circuit.

BRIEF DESCRIPTION OF THE DRAWINGS

FIG. 1 is a schematic diagram illustrating a semiconductor circuit including an ESD protection circuit and a power supply circuit according to an embodiment;

FIG. 2 is an equivalent circuit diagram of an ESD protection circuit of a first embodiment;

FIG. 5 is a waveform chart illustrating an operation example of the ESD protection circuit of the first embodiment;

FIG. 6 is an equivalent circuit diagram illustrating a modification of the ESD protection circuit of the first embodiment;

FIG. 7 is an equivalent circuit diagram illustrating a modification of the ESD protection circuit of the first embodiment;

FIG. 8 is an equivalent circuit diagram illustrating a modification of the ESD protection circuit of the first embodiment;

FIG. 15 is an equivalent circuit diagram illustrating a modification of the ESD protection circuit of the second embodiment;

FIG. 16 is an equivalent circuit diagram illustrating a modification of the ESD protection circuit of the second embodiment;

FIG. 17 is a diagram for describing an application example of the ESD protection circuit of one embodiment;

FIG. 18 is a diagram for describing an application example of the ESD protection circuit of one embodiment;

FIG. 19 is a diagram for describing an application example of the ESD protection circuit of one embodiment;

FIG. 24 is a diagram for describing an application example of the ESD protection circuit of one embodiment.

DETAILED DESCRIPTION

Figure 3:
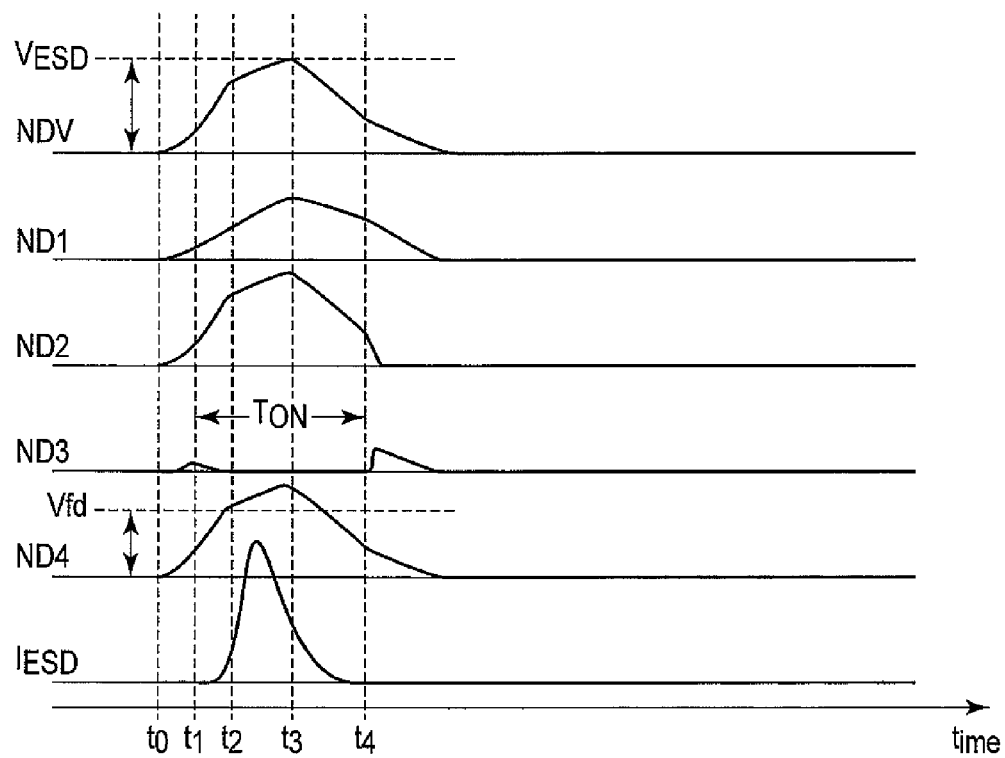
FIG. 3 is a waveform chart illustrating an operation example of the ESD protection circuit of the first embodiment.

Hereinafter, present embodiments are described in detail with reference to the drawings. Throughout the following description, elements having identical functions and configurations are denoted by the same reference signs and a repetitive description thereof is given only as necessary.

In general, according to one embodiment, a power supply circuit includes a first circuit connected to a first power supply line, to which a power supply voltage is applied, and a second power supply line; and a power supply clamp circuit connected to the first and second power supply lines, the power supply clamp circuit including a current path circuit which connects the first power supply line and the second power supply line to each other, and a control circuit that outputs a control signal for the current path circuit to the current path circuit, the current path circuit including a first transistor of a first conductivity type and a first diode group. The power supply circuit is driven during a period in which a first voltage is applied to the first power supply line and controls a potential of the first power supply line such that the potential of the first power supply line becomes a potential lower than the first voltage.

(1) First Embodiment

With reference to FIGS. 1 through 9, an ESD protection circuit according to a first embodiment and a power supply circuit including the ESD protection circuit are described.

(a) Circuit Configuration

Circuit configurations of the ESD protection circuit of the first embodiment and the power supply circuit including the ESD protection circuit are described with reference to FIGS. 1 and 2.

FIG. 1 is a block diagram illustrating the entire configuration of a semiconductor circuit including the ESD protection circuit and the power supply circuit according to the present embodiment.

As illustrated in FIG. 1, a semiconductor circuit 900 includes an internal circuit 2 which performs predetermined operations and functions required for a semiconductor circuit, a plurality of pads 32, 31, and 35 for input and output of signals and for application of a power supply voltage to the internal circuit 2, and a protection circuit 1 for protecting the internal circuit 2 from static electricity.

The internal circuit 2 is connected to an input/output pad (hereinafter, referred to as I/O pad) 35B for input and output of signals (for example, data and commands) via a signal line 35A. The internal circuit 2 is connected to a pad (hereinafter, referred to as power supply pad) 31B, to which a power supply voltage (drive voltage) VDD of the internal circuit 2 is applied, via a power supply line (first power supply line) 31A, and connected to a pad (referred to as ground pad) 32B, to which a ground voltage (reference voltage) VSS is applied, via a ground line (second power supply line) 32A.

Hereinafter, an interconnect system formed from the power supply line 31A and the power supply pad 31B may be denoted by "NDV" sometimes. In addition, an interconnect system formed from the ground line 32A and the ground pad 32B may be denoted by "NDG" sometimes.

For example, an ESD protection circuit 1 connected to the power supply line is provided in the semiconductor circuit 900 as one of component circuits of a power supply circuit (voltage regulation circuit) so that, when an ESD occurs in the input/output pad 35B based on the ground of the ground pad 32B, a surge (hereinafter, referred to as ESD pulse) attributable to the ESD may be discharged to the ground pad 32B via the power supply line 31A.

In the semiconductor circuit 900, a current path through which a current (hereinafter, referred to as ESD current) attributable to the ESD pulse flows is formed between two pads (here, the I/O pad and ground pad) via the ESD protection circuit 1 including a protection circuit 10 and a power supply clamp circuit 11.

This reduces a possibility that a high voltage (hereinafter, referred to as ESD voltage) attributable to the ESD pulse is applied to the internal circuit 2 of the semiconductor circuit 900, preventing the semiconductor device from being destructed due to the ESD.

As illustrated in FIG. 1, the power supply circuit 1 including the ESD protection circuit according to the present embodiment includes protection circuits (also referred to as protective elements) 10A and 10B provided near the input/output pad 35B, and the power supply clamp circuit 11 provided between the power supply line 31A and the ground line 32A.

For example, protection circuits 10A and 10B respectively include at least one diode 100. Hereinafter, diodes 100A and 100B in protection circuits 10A and 10B are also called ESD protection diodes 100A and 100B.

For example, at least one protection circuit 10A is connected between the signal line 35A and the power supply line 31A. The anode of diode 100A in protection circuit 10A is connected to the signal line 35A, and the cathode of diode 100A is connected to the power supply line 31A.

In addition, protection circuit 10B is connected between the signal line 35A and the ground line 32A. The anode of diode 100B in protection circuit 10B is connected to the ground line 32A, and the cathode of diode 100B is connected to the signal line 35A.

Besides the diodes 100, a capacitor and/or a transistor may be provided in protection circuits 10A and 10B.

The characteristics of diodes 100A and 100B in protection circuits 10A and 10B are suitably set such that, when the ESD occurs in the input/output pad 35B, the surge attributable to the ESD may be discharged to the power supply line 31A or the ground line 32A via protection circuits 10A and 10B.

The surge attributable to the ESD will be discharged to the power supply line 31A via protection circuit 10A when the surge attributable to the ESD is a voltage (plus potential) higher than a reference potential, and to the power supply line 32A via protection circuit 10B when the surge attributable to the ESD is a voltage (minus potential) lower than the reference potential. For example, when an accumulated electric charge of 2000 V is applied to a 100-pF capacitor in HBM for a period of about 100 ns and when a peak current of 1.3 A is applied, only a voltage below a breakdown voltage may be applied to the internal circuit 2 since the semiconductor circuit is provided with a path, through which a surge is discharged. For example, when the internal circuit 2 is driven by a power supply voltage VDD of 1.2 V to 1.3 V, a breakdown voltage of a transistor of the internal circuit 2 will be about 6 to 7 V. However, when the current path for discharging the ESD is insufficient, several tens V of voltages is applied to the internal circuit 2, resulting in destruction of the internal circuit 2. Therefore, by forming an adequate discharge path of the ESD in the semiconductor circuit, the voltage which is applied to the internal circuit 2 is controlled to be lower than 6 V, and destruction of the internal circuit 2 is prevented.

According to the present embodiment, the ESD protection circuit 1 in the power supply circuit functions as a protection circuit even though the internal circuit 2 is a device driven by a low voltage, and the ESD protection circuit 1 includes a circuit which does not malfunction by a normal operation of the internal circuit 2, and especially includes the power supply clamp circuit 11 which does not malfunction at the time of supplying power to the internal circuit 2.

According to the present embodiment, the power supply clamp circuit 11 of the power supply circuit including the ESD protection circuit includes at least a current path circuit 110 which connects the first power supply line 31A and the second power supply line 32A to each other, and a control circuit 111 which outputs a control signal for controlling the current path circuit 110 to the current path circuit 110. The current path circuit 110 is driven by a first transistor of a first conductivity type and one or more diodes during a period in which a first voltage is applied to the first power supply line 31A, and controls a potential of the first power supply line such that the potential becomes lower than the first voltage.

In FIG. 1, although only one ESD protection circuit is illustrated for simplification of illustration, a plurality of ESD protection circuits may be provided in a semiconductor chip, as component circuits of the power supply circuit.

The configuration of the power supply clamp circuit included in the ESD protection circuit according to the present embodiment is described with reference to FIG. 2.

FIG. 2 is an equivalent circuit diagram illustrating a circuit configuration of the power supply clamp circuit in the ESD protection circuit.

As illustrated in FIG. 2, in the present embodiment, the power supply clamp circuit 11 of the ESD protection circuit 1 includes a circuit (referred to as a current path circuit in the present embodiment) 110 which allows the flow of an ESD current between the power supply line 31A (NDV) and the ground line 32A (NDG) when an ESD pulse is applied to the pad, and a circuit (referred to as timing control circuit in the present embodiment) 111 which controls timing when to allow the flow of the ESD pulse.

The current path circuit 110 includes a circuit constituting a current path, in a chip of the semiconductor device 900, which connects the I/O pad 35B to the power supply pad 31B or the ground pad 32B serving as the reference power supply pad via the power supply line 31A or the power supply line 32A so that the ESD current may not be supplied to the internal circuit 2 when the ESD pulse is applied to the I/O pad 35B.

For example, the current path circuit 110 includes a P-channel field effect transistor (for example, MOS transistor) PT1 and three diodes DI1, DI2, and DI3.

An end of a current path of the P-channel type MOS transistor (hereinafter, referred to as P-type MOS transistor) PT1 is connected to the power supply line 31A. The other end of the current path of P-type MOS transistor PT1 is connected to the ground line 32A via two diodes (hereinafter, referred to as a diode string) DI1 and DI2 which are connected in series with each other.

The gate of P-type MOS transistor PT1 is connected to a node ND3 serving as an output node of the timing control circuit 111.

Diode string DI1 and DI2 is connected in series with each other between a node ND4 from the power supply line 31A via P-type MOS transistor PT1 and the ground line 32A. In regard to diode DI1 disposed near the power supply line 31A among the two diodes DI1 and DI2, which constitute the diode string, the anode of diode DI1 is connected to a node ND4 in the other end of the current path of P-type MOS transistor PT1. In regard to diode DI2 near the ground line among the two diodes DI1 and DI2 which constitute the diode string, the anode of diode DI2 is connected to the cathode of diode DI1, and the cathode of diode DI2 is connected to the ground line 32A.

In addition, in the current path circuit 110, the anode of diode DI3 is connected to the ground line 32A, and the cathode of diode DI3 is connected to node ND4. Diode DI3 and the diode string DI1, DI2 are connected to each other in a cross-coupled manner.

The diode string DI1, DI2 is forward-biased when the potential of the internal node ND4 of the current path circuit 110 becomes higher than the potential of the ground line 32A by a threshold voltage of the diode string. On the other hand, diode DI3 is forward-biased when the potential of the ground line 32A becomes higher than the potential of the internal node ND4 by a threshold voltage of the diode. For example, the sum of forward voltages (ON state voltages) of the plurality of diodes DI1 and DI2 which constitute the diode string is set to be substantially the same as the drive voltage (power supply voltage) VDD of the semiconductor device, i.e., or to be greater than the power supply voltage. For example, when the drive voltage VDD is 1.2 V, the forward voltage of the diode string DI1 and DI2 is calculated as 0.6 V×2=1.2 V so as to be almost the same as the power supply voltage.

Since the threshold voltage of the diode connected between the power supply line 31A and the ground line 32A via the current path of P-type MOS transistor PT1 is set to approximately greater than or equal to the power supply voltage, a malfunction (for example, generation of a leakage current or a rush current) of the power supply clamp circuit is prevented at the time of being powered.

ON/OFF control of the power supply path circuit 110 is performed by the control signal (potential) which is input to the gate of P-type MOS transistor PT1. That is, an output of the timing control circuit 111 is used as a control signal for the ON/OFF control of the current path circuit 110.

When an "L" level signal (for example, a voltage of 0 V) is input to the gate of P-type MOS transistor PT1, P-type MOS transistor PT1 is turned on. When P-type MOS transistor PT1 is turned on, the power supply line 31A and the internal node ND4 enter a conduction state. And when a forward potential equal to or higher than the threshold voltage is applied to diodes DI1 and diode DI2 which are connected in series with each other, a current (ESD current) flows from the internal node ND4 to the ground line 32A via P-type MOS transistor PT1 and the two diodes DI1 and DI2.

That is, when a forward voltage higher than a threshold voltage Vfd of the diode string DI1, DI2 is applied to the anode of the diode string DI1, DI2 connected to the current path of P-type MOS transistor PT1 in a state where P-type MOS transistor PT1 of the current path circuit 110 is in ON state, the power supply clamp circuit 110 allows the flow of the current from the power supply line 31A to the ground line 32A.

Conversely, when an "H" level signal is input to the gate of P-type MOS transistor PT1, P-type MOS transistor PT1 is turned off. Since the power supply line 31A and node ND4 are electrically isolated from each other by P-type MOS transistor PT1 in the off-state, the current does not flow from the power supply line 31A to the ground lines 32A.

Diode DI3 constitutes a current path of the current which flows to node ND4 from the ground line 32A when the ESD occurs. When the potential of node ND4 is lower than the potential of the ground line 32A and when the P-type MOS transistor is switched on to enter a conduction state while a forward voltage greater than or equal to the threshold of the diode is applied to diode DI3, the ESD current flows from the power supply line 32A to the power supply line 31A.

In the present embodiment, it is preferable that P-type MOS transistor PT1 be formed to allow the flow of a very large ESD current so as to sufficiently drop the voltage applied to the internal circuit 2 to a level less than or equal to the breakdown voltage. It is preferable that a size (for example, channel width) of the transistor be greater than or equal to 100000 μm, so that P-type MOS transistor PT1 may have a large current drive capability.

The timing control circuit 110 performs on/off control of the current path circuit 110.

The timing control circuit 110 generates the control signal for controlling the current path circuit 110 when the ESD pulse occurs, and outputs the generated control signal to the current path circuit.

The timing control circuit 110 includes a delay circuit DC and an inverter circuit IVC.

The delay circuit DC includes a resistor element R1 having a certain resistance value Ra, and a capacitor element C1 having a certain capacitance value Ca. Resistor element R1 is formed using a silicon layer on a semiconductor substrate, which is formed at substantially the same time as, for example, the gate electrode of the transistor, or using a diffusion layer in the semiconductor substrate. Capacitor element C1 is a MOS capacitor, for example. A MOS transistor may be provided in the delay circuit DC instead of resistor element R1.

One terminal of resistor element R1 is connected to the power supply line 31A, and the other terminal of resistor element R1 is connected to a node ND1. One terminal of capacitor element C1 is connected to node ND1. The other terminal of capacitor element C1 is connected to the ground line 32A.

Node ND1 serves as a connection node between the terminal of resistor element R1, and the terminal of capacitor element C1. Hereinbelow, node ND1 is referred to as connection node ND1.

In regard to the delay circuit DC, the resistance value Ra of resistor element R1 and the capacitance value Ca of capacitor element C1 are suitably set such that when the potential of the power supply line 31A steeply rise, the potential at the connection node ND1 between resistor element R1 and capacitor element C1 more slowly rises than the potential of the power supply line 31A.

A circuit DC formed from resistor element R1 and capacitor element C1 is referred to as an RC circuit.

The inverter circuit IVC includes a plurality of inverters which are connected in series with each other.

Power supply terminals (sources of P-type MOS transistors) of inverters IV1, IV2, IV3, and IV4 are connected to the power supply line 31A, and ground terminals (sources of N-type MOS transistors) of inverters IV1, IV2, IV3, and IV4 are connected to the ground line 32A. When the voltage of the power supply line 31A rises during the application of the ESD, the voltage of the power supply line 31A serves as a drive voltage of each inverter.

The inverter circuit IVC includes four inverters IV1, IV2, IV3, and IV4, for example. The three inverters IV1, IV2, and IV3 are CMOS inverters formed from a P-type MOS transistor and an N-type MOS transistor (N-channel type MOS transistor).

Inverter IV4 of the last stage in the timing control circuit 111 includes a P-type transistor PT2, an N-type MOS transistor NT1, and a resistor element R2. Resistor element R2 is connected in series between drains of P-type MOS transistor PT2 and N-type MOS transistor NT1.

An end of the current path of P-type MOS transistor PT2 is connected to the power supply line 31A. The other end of the current path of P-type MOS transistor PT2 is connected to one terminal of resistor element R2. An end of the current path of N-type MOS transistor NT1 is connected to the other terminal of resistor element R2. The other end of the current path of N-type MOS transistor NT1 is connected to the ground line 32A. The connection node between N-type MOS transistor NT1 and resistor element R2 is a node ND3, and node ND3 serves as an output node of the inverter circuit IVC.

The gate of P-type MOS transistor PT2 and the gate of N-type MOS transistor NT1 are connected to an output node ND2 of inverter IV3. Hereinbelow, node ND2 may be referred to as connection node ND2.

Inverter IV4 is set such that the current drive capability (drive current) of P-type MOS transistor PT2 is smaller than the current drive capability of N-type MOS transistor NT1. Sizes of P-type MOS transistor PT2 and N-type MOS transistor NT1 are set such that a ratio of the current drive capabilities of P-type MOS transistor PT2 and N-type MOS transistor NT1 may be about 1:10. Since the size of P-type MOS transistor PT1 of the current drive circuit 110 is large, for example, it is about 100000 μm, the sizes of P-type MOS transistor PT2 and N-type MOS transistor NT1 of inverter IV4 of the last stage are also large.

Furthermore, the resistance value Rb of the second resistor element R2 is set to be a predetermined resistance value so that a response speed of the inverter formed from the P- and N-type MOS transistors PT2 and NT1 may be adjusted, and resistor element R2 having a relatively large resistance value is used for inverter IV4 of the last stage.

For this reason, in regard of inverter IV4 of the last stage, the "H" level-to-"L" level response speed of an output signal of inverter IV4 is faster than the "L" level-to-"H" level response speed of an output signal of inverter IV4.

In addition, in regard to inverters IV1, IV2, and IV3 other than the inverter of the last stage in the inverter circuit, the sizes of the P-type MOS transistor and N-type MOS transistor are set so that the ratio of the current drive capabilities of the P-type MOS transistor and N-type MOS transistor which constitute the inverter may be set to about 1:1. In this case, the ratio of the sizes of the P-type MOS transistor and N-type MOS transistor of each of inverters IV1, IV2, and IV3 is set to about 2:1.

To properly drive inverter IV4 of the last stage which has a large size, the sizes of inverters IV1, IV2, and IV3 other than the inverter of the last stage of the inverter circuit IVC are set.

An output node ND3 of the inverter circuit IVC as an output node of the timing control circuit 111 is connected to the gate of P-type MOS transistor PT1 of the current path circuit 110, and operation of the current path circuit 110 is controlled by the output of the timing control circuit 111 which serves as the control signal.

During application of the ESD pulse, the potential of the output node ND3 of inverter IV4 of the last stage in the timing control circuit 111 is set to the "L" level. As the result, a current path is formed in the current path circuit 110, and the ESD current flows through the current path circuit 110.

In addition, in the timing control circuit 111, the number of the inverters of the inverter circuit IVC may not be limited to 4 as long as it is the number which enables the "L" level signal to be applied to the gate of P-type MOS transistor PT1 in the current path circuit during occurrence of the ESD.

With the above-described configuration, when the ESD occurs in the semiconductor circuit, the ESD protection circuit of the present embodiment and the power supply clamp circuit in the power supply circuit including the ESD protection circuit control the potential of the power supply line of the semiconductor circuit so that the ESD pulse may be discharged to the ground line from the power supply line.

(b) Operation

Operation of the ESD protection circuit in the power supply circuit of the first embodiment is described with reference to FIGS. 3 to 5. Furthermore, in addition to FIGS. 3 to 5, FIGS. 1 and 2 are also suitably used here to describe the operation of the ESD protection circuit of the present embodiment.

Figure 4:
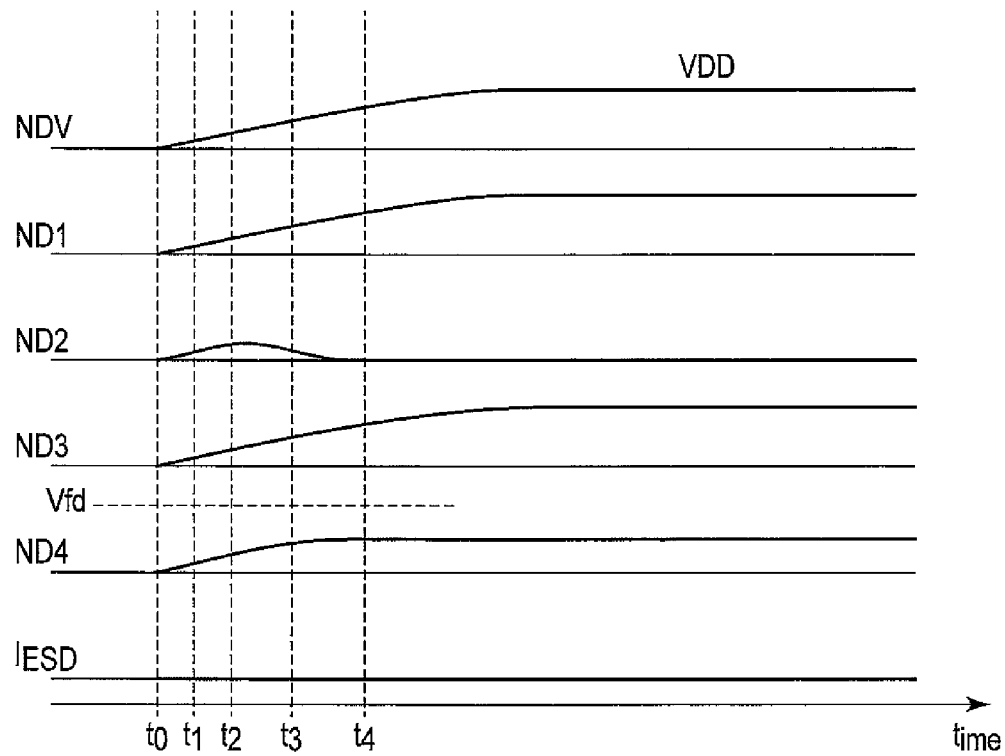
FIG. 4 is a waveform chart illustrating an operation example of the ESD protection circuit of the first embodiment.

FIG. 3 illustrates a waveform chart for describing the operation of the ESD protection circuit in the power supply circuit of the present embodiment when an ESD pulse is applied. In FIG. 3, a horizontal axis of the waveform chart corresponds to time, and a vertical axis of the waveform chart corresponds to voltages (or currents).

FIG. 3 illustrates changes in the potential of each of nodes ND1, ND2, ND3, and ND4 of the power supply clamp circuit of the ESD protection circuit according to change in time. FIG. 3 schematically illustrates the waveform of current (for example, ESD current) $I_{ESD}$ which flows through the inside of the power supply clamp circuit (current path circuit) of the ESD protection circuit. In regard to the current $I_{ESD}$ which flows through the inside of the current path circuit 110, the horizontal axis of the waveform chart corresponds to time, and the vertical axis of the waveform chart corresponds to current values. Hereinbelow, not only the ESD current but also a current (for example, leakage current) which flows through the inside of the current path circuit 110 is denoted by "$I_{ESD}$."

As described above, node ND1 is a node between resistor element R1 and capacitor element C1 in the delay circuit DC of the timing control circuit 111. Node ND2 is an input node of inverter IV4 of the last stage of the timing control circuit 111. Node ND3 is an output node of inverter IV4 of the last stage, and it is a node between resistor element R2 which is included in inverter IV4 and an end of the current path of the N-type MOS transistor. Node ND4 is a connection node in the current path circuit 110, and a connection node between an end of the current path of P-type MOS transistor PT1 and the anode of diode DI1.

At the time of an ESD test, all pads other than the power supply pad serving as a reference potential are floating, and internal nodes ND1, ND2, ND3, and ND4 in the circuit are all in floating state.

The ESD pulse is a pulse which has a pulse width of about 100 nsec and steeply rises for a rising period of about several to several tens nsec. For example, a voltage value of the ESD pulse in the ESD test is about 6 V or higher.

Here, an operation waveform at the time of application of the ESD pulse of a plus surge based on the ground pad is illustrated in FIG. 3. At the time of the ESD test, at timing of time t0, the ESD pulse with a steep pulse shape is applied to the I/O pad 35A, and the potential of the power supply line 31A rises via the diode of protection circuit 10A illustrated in FIG. 1. In regard to the potential of node ND1, it is pulled down to the ground potential via capacitor element C1 which is capacitively coupled to the ground line, and is difficult to rise than the power supply line NDV (31A) because node ND1 is connected to the power supply line NDV (31A) via resistor element R1. Therefore, the potential rises with slow timing.

After that, over time t1, the potential of the power supply line NDV rises and is applied to each of inverters IV1, IV2, IV3, and IV4 as the driver voltage of the inverter circuit IVC, so that each of inverters IV1, IV2, IV3, and IV4 enters a drivable state.

The potential of node ND2 rises up to the level of the power supply line VDN via the P-type MOS transistor of inverter IV3 which is a preceding state with respect to the inverter of the last stage.

In regard to the potential of node ND3, since node ND3 is connected to resistor element R2 having a comparatively high resistance value and a drive capability (current drive capability) of P-type MOS transistor PT2 of the last-stage inverter IV4 is small, a voltage of node ND3 hardly rises.

At timing of time t1, at a time point when the potential of node ND2 which simultaneously rises with the potential of the power supply line NVD reaches the threshold potential of N-type MOS transistor NT1 of inverter IV4, the potential of node ND3 is set to a ground level (VSS level or the "L" level) by the N-channel MOS transistor NT1 having a large driving capability and P-type MOS transistor PT2 having a small driving capability. After a lapse of a period of time t2 from time t1, the potential of node ND3 becomes the "L" level, and the potential of the "L" level is applied to the gate of P-type MOS transistor PT1 of the current path circuit 110 where the gate is connected to node ND3. As the result, P-type MOS transistor PT1 of the current path circuit 110 is turned on. P-type MOS transistor PT1 remains in ON state during a period $T_{ON}$ in which the potential of node ND3 is kept "L" level (the ground voltage, for example, 0 V).

In addition, at time t2, when the potential of the connection node ND4 between P-type MOS transistor PT1 and diode DI1 rises to a potential higher than the sum (for example, 0.6 V+0.6 V=1.2 V) of the forward voltage of diode DI1 and the forward voltage of diode DI2, by the voltage (ESD voltage) applied from the power supply line NDV (31A) via P-type MOS transistor PT1 which remains in ON state, the current path circuit 110 is turned on. As the result, during a period from time t2 to time t3, the ESD current $I_{ESD}$ flows from the power supply line 31A to the ground line 32A by the current path circuit 110 which stays in ON state, according to the driving capability of the current path circuit 110.

In this way, since the current path circuit 110 enables the current $I_{ESD}$ to flow from the power supply line 31A to the ground line 32A, the rising of the potential of the power supply line 31A is suppressed.

At timing of time t3, the voltage of the power supply line NVD reaches a peak voltage. The driving capability of the current path circuit is set such that this voltage is a level less than or equal to the breakdown voltage of the internal circuit 2. After time t3, the discharge of the ESD by the current path circuit 110 is carried out until the potential of node ND4 reaches the threshold voltage of the diode string DI1, DI2, so that the voltage of the power supply line NDV also falls. When node ND4 becomes less than or equal to the threshold voltage of the diode string DI1, DI2, the discharge of the ESD by the diode string DI1, DI2 also stops, and the potential of the semiconductor circuit drops by natural electric discharge.

After that, within a period from time t3 to time t4, the output signals of inverters IV1, IV2, and IV3 of the inverter circuit IVC are sequentially determined based on the potential of node ND1 which slowly rises by resistor element R1 and capacitor element C1 of the delay circuit DC.

That is, when the potential of node ND1 is set to the level of the power supply line NDV, inverter IV1 of a first stage with an input node connected to node ND1 outputs the "L" level signal. Inversion of the signal is repeated according to the number of the inverters in the inverter circuit IVC. The output signal (the potential of node ND2) of inverter IV3 of a third stage becomes the "L" level signal. Thus, the output signal of inverter IV4 of the last stage becomes the level of the power supply line NDV, so that P-type MOS transistor PT1 enters an OFF state and the current path circuit 100 is switched off.

In this way, at the time of occurrence of the ESD, the potential of the power supply line 31A can be controlled by the ESD protection circuit 1 of the present embodiment, and the ESD pulse can be discharged to the ground line 32A, so that the internal circuit 2 connected to the power supply line 31A and ground line 32A like the ESD protection circuit 1 can be protected from the ESD.

Operation of the ESD protection circuit at the time of normal power supply is described with reference to FIG. 4.

FIG. 4 illustrates the waveform chart for describing the operation of the ESD protection circuit of the present embodiment when a power supply voltage with a regular rising speed is supplied to the semiconductor circuit.

In FIG. 4, the horizontal axis of the waveform chart corresponds to time, and the vertical axis of the waveform chart corresponds to voltage values (or current values). FIG. 4 illustrates changes in the potential of each of nodes ND1, ND2, ND3, and ND4 of the power supply clamp circuit of the ESD protection circuit, according to change in time.

As illustrated in FIG. 4, at the time of supplying power with a power supply voltage rising at normal speed (first rising speed), the potential of the power supply line NDV rises at a slow speed, that is, for a time longer than a delay time which is set in the timing control circuit 110 of the power supply clamp circuit 11.

The potential of node ND1 of the delay circuit DC in the timing control circuit 110 rises at the substantially same speed/timing as the power supply line NDV.

In addition, since the potential of the power supply line NDV (and the potential of node ND1) rise for a time longer than the time which is set in the delay circuit DC, the potential of node ND2 does not rise nearly at all but is maintained at the level of about the ground voltage.

The potential of node ND3 rises according to the rise of the potential of the power supply line NDV due to the charging the node by P-type MOS transistor PT2 of inverter IV4 of the last stage. Therefore, at the time of supplying a power supply voltage rising at normal speed, P-type MOS transistor PT1 of the current path circuit 110 remains in the OFF state. As the result, the power supply line NDV (31A) and the ground line NDG (32A) are electrically isolated from each other by the current path circuit 110 being in the OFF state, and the current which flows through the inside of the power supply path circuit 110 is not generated.

Therefore, as illustrated in FIG. 4, a leakage current from the power supply line NDV (31A) to the ground line NDG (32A) does not occur at the time of supplying power.

In this way, at the time of supplying power, the leakage current between the power supply line and the ground line, which flows via the ESD protection circuit (current path circuit) serving as a component of the power supply circuit, is suppressed by the ESD protection circuit of the present embodiment.

Operation of the ESD protection circuit of the present embodiment at the time of supplying power with a power supply voltage with a steep rising speed to the semiconductor circuit is described with reference to FIG. 5.

FIG. 5 illustrates a waveform chart for describing the operation of the ESD protection circuit of the present embodiment when a power supply voltage with a steep rising speed is supplied to the semiconductor circuit.

In FIG. 5, the horizontal axis of the waveform chart corresponds to time, and the vertical axis of the waveform chart corresponds to voltage values (or current values). FIG. 5 illustrates changes in the potential of each of nodes ND1, ND2, ND3, and ND4 of the power supply clamp circuit of the ESD protection circuit, according to change in time.

As illustrated in FIG. 5, at the time of supplying power, a power supply voltage having a waveform of a steeply rising slope like the ESD pulse is likely to be applied to the power supply line sometimes.

In FIG. 5, the power supply voltage is supplied at timing of time t0, and rising of the potential of the power supply line NDV is started. The supplied power supply voltage rises at a steep rising speed (second rising speed) faster than the rising speed of the normal power supply voltage.

The potential of the input node ND2 of inverter IV4 of the last stage of the timing control circuit 111 rises with the substantially same timing as the potential of the power supply line NDV. The potential of the connection node ND1 of resistor element R1 and capacitor element C1 of the delay circuit DC slowly rises at a speed slower than the rising speed of the potential of the power supply line NDV.

When the power supply voltage with a steep rising speed is supplied, within a period from time t0 to time t1, the potential of node changes in the substantially same manner when the ESD pulse is applied, and each circuit is driven in the substantially same manner.

At time t2, if the potential of node ND4 connected to the power supply line NDV (31A) via P-type MOS transistor PT1 of the current path circuit 110 rises up to the potential higher than the threshold voltage of the diode string DI1, DI2, the current path circuit 110 is turned on. For this reason, the current path circuit 110 is driven such that the current may flow from the power supply line NDV (31A) to the ground line by the current path circuit 110 being in ON state, suppressing the rising of the potential of the power supply line NDV (31A).

However, when the power supply voltage is smaller than the voltage value of the ESD pulse, for example, when the level of the power supply voltage is 1.2 V to 1.3 V like the present embodiment, unlike the case where the ESD pulse is applied to the power supply line NDV (31A), the voltage of the power supply line NDV (31A) rises only up to about 1.2 V to 1.3 V.

As described above, in the current path circuit 110, the threshold voltage value of the diode string DI1, DI2 which allows the flow of the current from the power supply line NDV (31A) to the ground line NDG (32A) via P-type MOS transistor PT1 is set to about 1.2 V. In this case, the voltage (for example, power supply voltage) applied from the power supply line NDV (31A) to diodes DI1 and DI2 via P-type MOS transistor PT1 becomes less than or equal to the threshold voltage value of the diode string DI1, DI2.

In this way, since the potential difference between the power supply line NDV (31A) and the ground line NDG (32A) at the time of supplying the power supply voltage VDD is smaller than the potential difference between the power supply line NDV (31A) and the ground line NDG (32A) at the time of application of the ESD pulse, as illustrated in FIG. 5, the current $I_{ESD}$ which is directed to the ground line NDG (32A) from the power supply line NDV (31A) does not flow through the inside of the current path which includes P-type MOS transistor PT1, and the diode string DI1, DI2.

At timing of from time t3 to time t4, as described above, the input/output signal of each of inverters IV1, IV2, and IV3 of the inverter circuit IVC is sequentially determined by node ND1 where the potential of which rises at timing delayed by resistor element R1 and capacitor element C1 of the delay circuit DC. The potential of the input node ND2 of inverter IV4 of the last stage falls toward the "L" level from the "H" level.

At timing of time t4, if the potential of node ND2 falls to less than or equal to the threshold voltage of N-type MOS transistor NT1 in inverter IV4 and N-type MOS transistor NT1 is turned off, P-type MOS transistor PT2 in inverter IV4 is turned on. As described above, since the driving capability of P-type MOS transistor PT2 is small, and resistor element R2 having a high resistance value is connected to the output node ND3 of inverter IV4, node ND3 is charged at a slow response speed to reach the power supply voltage VDD. When node ND3 of inverter IV4 of the last stage is charged, the power supply voltage NDV of node ND3 is applied to the gate of the P-type MOS transistor, and the current path circuit 110 is turned off.

Like the case where the power supply voltage causes the chattering, at the time of supplying power, even though the power supply voltage overshoots and hence a slightly high potential is applied to the power supply line NDV (31A) or the voltage applied to the power supply line NDV (31A) fluctuates, if the potential difference between the power supply line NDV (31A) and the ground line NDG (32A) is less than or equal to the threshold voltage of the diode string DI1, DI2 that allows the flow of current from the power supply line 31A (NDV) in the current path circuit 110 to the ground line 32A (NDG), the current path which enables an excessive current to flow between the power supply line NDV (31A) and the ground line NDG (32A) is not formed in the current path circuit 110.

Therefore, by using the power supply circuit including the ESD protection circuit of the present embodiment, it is possible to prevent the power supply line from undergoing a rapid potential drop at the time of supplying power, prevent an excessive current from flowing between the power supply line and the ground line, and prevent failure from occurring in the semiconductor circuit when the semiconductor circuit is powered. In a semiconductor circuit including the power supply circuit (ESD protection circuit) of the present embodiment, a fault, which have been found in conventional semiconductor circuits, such that a rush current occurs at the time of supplying a power supply voltage with a steep waveform, does not occur.

(c) Modification

A modification of the power supply circuit including the ESD protection circuit of the first embodiment is described with reference to FIGS. 6 through 8.

FIGS. 6 through 8 are equivalent circuit diagrams illustrating modifications of the ESD protection circuit according to the present embodiment.

In a current path circuit 110A of an ESD protection circuit of FIG. 6, two diodes DI1 and DI3 are connected to each other between a power supply line 31A and a ground line 32A via a current path of a P-type MOS transistor.

Unlike the current path circuit 110 illustrated in FIG. 2, a current path circuit 110A of FIG. 6 has a configuration in which only one diode DI1 is connected between a power supply line 31A and a ground line 32A via a current path of a P-type MOS transistor PT1. The anode of diode DI1 is connected to the other end of the current path of P-type MOS transistor PT1, and the cathode of diode DI1 is directly connected to the ground line 32A. For example, when the threshold voltage of diode DI1 is about 0.6 V, node ND4 is at 0.6 V or higher, and the P-type MOS transistor is in the on-state, the ESD current $I_{ESD}$ may pass through the current path circuit 110A. Operation of the current path circuit of FIG. 6 is the same as that of the current path circuit illustrated in FIG. 2.

As illustrated in FIG. 7, in a current path circuit 110B, a diode DI3 which sends a current directed from a ground line 32A to a power supply line 31A is directly connected between the power supply line 31A and the ground line 32A, without intervention of a P-type MOS transistor PT1.

The anode of diode DI3 is directly connected to the ground line 32A, and the cathode of diode DI3 is directly connected to the power supply line 31A.

As described above, in a normal operation (at the time of application of the power supply voltage VDD) of a semiconductor circuit, a reverse bias voltage is applied to diode DI3. Diode DI3 is an element which is driven only when the ESD pulse is applied so that the potential of the ground line 32A may become higher than the potential of the power supply line 31A.

So, diode DI3 may be directly connected between the power supply line and the ground line like in the current path circuit 110B illustrated in FIG. 7.

In addition, as illustrated in FIG. 8, in a case where one diode DI1 is connected between a node ND4 and a ground line 32A via a P-type MOS transistor PT1 in a current path circuit 110C, a diode DI3 in which a direction from the ground line side to the power supply line side represents a forward bias state may be directly connected between a power supply line 31A and the ground line 32A.

Figure 9:
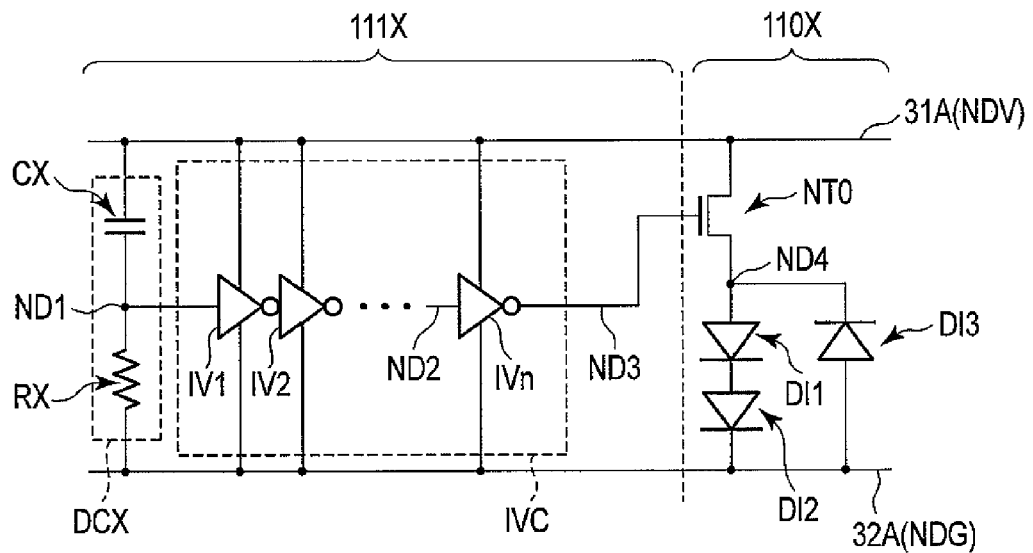
FIG. 9 is an equivalent circuit diagram illustrating a modification of the ESD protection circuit of the first embodiment.

FIG. 9 illustrates a configuration example of a power supply clamp circuit different from those of FIGS. 6 through 8.

As illustrated in FIG. 9, in a timing control circuit 111X, a capacitor element C1 is connected between a power supply line 31A and a node ND1, and a resistor element R1 is connected between node ND1 and a ground line 32A.

In addition, in a current path circuit 110X, an N-type MOS transistor NT0 is connected, instead of the P-type MOS transistor, between the power supply line 31A and a node ND4 serving as the anode of a diode DI1. When N-type MOS transistor NT0 is used for the current path circuit 110, the number (for example, the number of inverters is an odd number) of inverters connected between node ND1 and the gate of N-type MOS transistor NT0 and drive characteristics (for example, a current drive capability of N-type and P-type MOS transistors) of an inverter IVn of a last stage are suitably adjusted such that substantially the same effect as the circuits of FIG. 2 and FIGS. 6 through 8 may be obtained.

As described above, as illustrated in FIGS. 6 through 9, even though the current path circuit differs in an internal configuration (for example, diodes) from the current path circuit of the power supply clamp circuit illustrated in FIG. 2, the ESD protection circuit including the power supply clamp circuit illustrated in FIGS. 6 through 9 can acquire substantially the same effect as the ESD protection circuit including the power supply clamp circuit of FIG. 2.

(d) Conclusion

The power supply clamp circuit of the ESD protection circuit in the power supply circuit of the present embodiment includes the current path circuit 110, including P-type MOS transistor PT1 and one or more diode DI1 in which current paths are connected in series, between the power supply line and the ground line.

The power supply clamp circuit 11 comes to operate, when P-type MOS transistor PT1 is turned on by the control signal from the timing control circuit 111 included in the power supply clamp circuit 11 and when the voltage more than the threshold voltage is applied to diode DI1.

Therefore, the ESD protection circuit 1 in the present embodiment fully properly functions in a low voltage semiconductor device which uses a power supply voltage of 1.2 V or lower.

When the ESD pulse is applied, in a certain period controlled by the timing control circuit 111, the power supply clamp circuit 11 which is turned on by the ESD pulse allows a current (ESD current) to flow from the power supply line 31A to the ground line 32A. That is, during occurrence of the ESD in the semiconductor circuit, the current path which discharges the ESD pulse to the ground lines (ground pads or reference pins) 32A and 32B is formed in the chip of the semiconductor circuit 900 by the ESD protection circuit of the present embodiment.

Thus, the semiconductor circuit 900 which includes the ESD protection circuit of the present embodiment can prevent its internal circuit 2 from being destructed by the ESD.

In the ESD protection circuit of the power supply circuit of the present embodiment, unless the potential of the connection node ND4 between P-type MOS transistor PT1 and diode DI1 in the power supply path circuit may not reach the forward voltage Vfd of diode DI1 at the time of normal power supply, the power supply clamp circuit 11 does not operate. Therefore, even in the case where the power supply voltage rises steeply in the ESD protection circuit of the power supply circuit of the present embodiment at the time of supply of the power supply voltage, the power supply clamp circuit 11 may not malfunction, and furthermore it is possible to prevent the power supply clamp circuit 11 from excessively lowering the potential of the power supply line 31A, or prevent an excessive current from flowing from the power supply line 31A to the ground line 32A.

In addition, the ESD protection circuit in the power supply circuit of the present embodiment can be realized with a power supply clamp circuit using an N-type MOS transistor instead of the power supply clamp circuit 11 (current path circuit 110) using a P-type MOS transistor PT1.

So, the semiconductor circuit including the ESD protection circuit of the present embodiment can perform a stable power-on operation.

In regard to a general ESD protection circuit, when a power supply clamp circuit has a circuit configuration including only diodes, for example, a circuit configuration in which a plurality of diodes are connected in series with each other, there is a concern about occurrence of a leakage current attributable to a parasitic element such as Darlington effect and an increase in a leakage current in a high temperature environment of a chip.

However, in the power supply clamp circuit 11 of the ESD protection circuit 1 of the present embodiment, since P-type MOS transistor PT1 in the current path circuit 111 functions as a switch which performs ON/OFF control of the power supply clamp circuit 11, the leakage current can be considerably suppressed at the time of supplying power.

In regard to the circuit (timing control circuit) 111 for driving P-type MOS transistor PT1 in the current path circuit 110 of the power supply clamp circuit in the present embodiment, since the size of the transistor (for example, transistor which constitutes an inverter) in the circuit 111 can be reduced, the area of the power supply clamp circuit can be comparatively reduced.

As described above, according to the ESD protection circuit of the present embodiment, it is possible to provide a power supply circuit including the ESD protection circuit in which operation is stable.

(2) Second Embodiment

A power supply circuit including an ESD protection circuit according to a second embodiment is described with reference to FIGS. 10 through 16.

In the second embodiment, a description about components and functions the same as those of the ESD protection circuit described in the first embodiment is omitted, or is made if needed.

(a) Circuit Configuration

A circuit configuration of a power supply circuit including the ESD protection circuit of the second embodiment is described with reference to FIG. 10.

Figure 10:
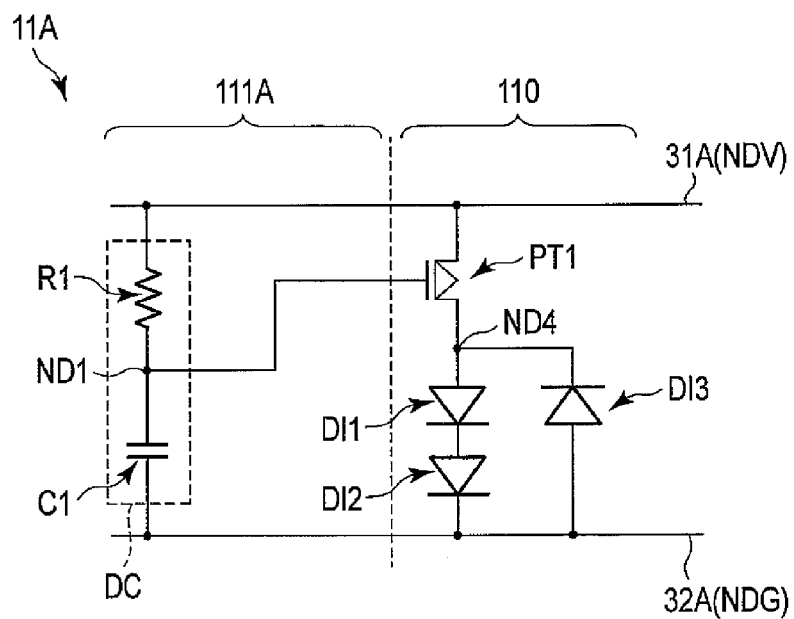
FIG. 10 is an equivalent circuit diagram of an ESD protection circuit of a second embodiment.

FIG. 10 is an equivalent circuit diagram schematically illustrating an internal configuration of a power supply clamp circuit included in the ESD protection circuit of the second embodiment.

As illustrated in FIG. 10, the ESD protection circuit as an internal configuration of the power supply circuit according to the second embodiment differs, in the internal configuration of a timing control circuit 111A of a power supply clamp circuit 11A, from the ESD protection circuit of the first embodiment.

The timing control circuit 111A of the power supply clamp circuit 11A of FIG. 10 does not include an inverter circuit connected to a current path circuit 110.

In the timing control circuit 11A, a terminal of a first resistor element R1 and a terminal of a capacitor element C1 are connected to a connection node ND1 like the first embodiment. A control terminal of the current path circuit 110, i.e., the gate of a P-type MOS transistor PT1 of the current path circuit 110 is directly connected to a connection node ND1 of resistor element R1 and capacitor element C1.

Connection nodes ND2 and ND3 formed by an inverter circuit 11A of FIG. 2 may not formed in the power supply clamp circuit 11A of FIG. 10.

Thus, in regard to the power supply circuit including the ESD protection circuit of the present embodiment, the number of elements in the power supply clamp circuit 11A is reduced.

(b) Operation

Figure 11:
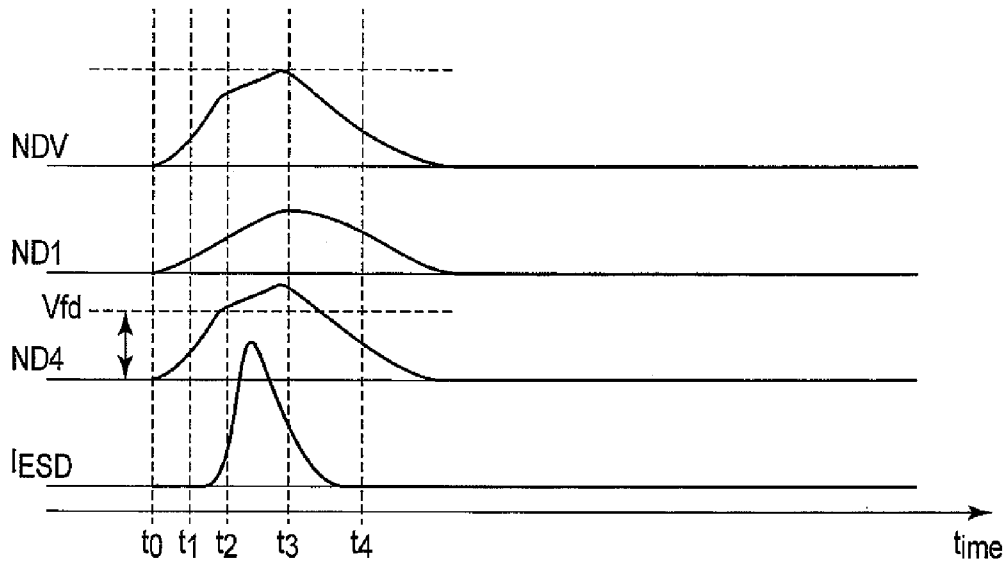
FIG. 11 is a waveform chart illustrating an operation example of the ESD protection circuit of the second embodiment.
Figure 12:
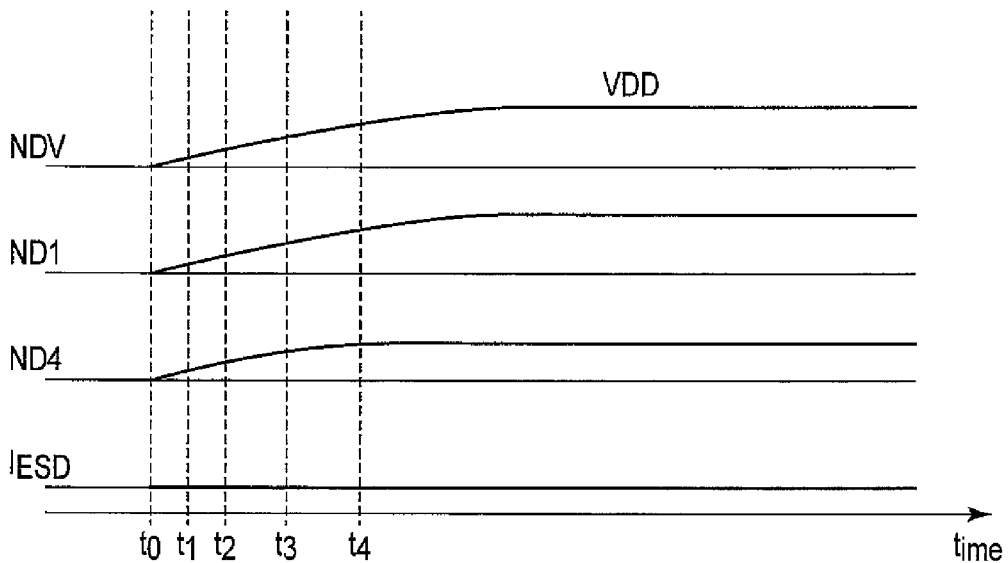
FIG. 12 is a waveform chart illustrating an operation example of the ESD protection circuit of the second embodiment.
Figure 13:
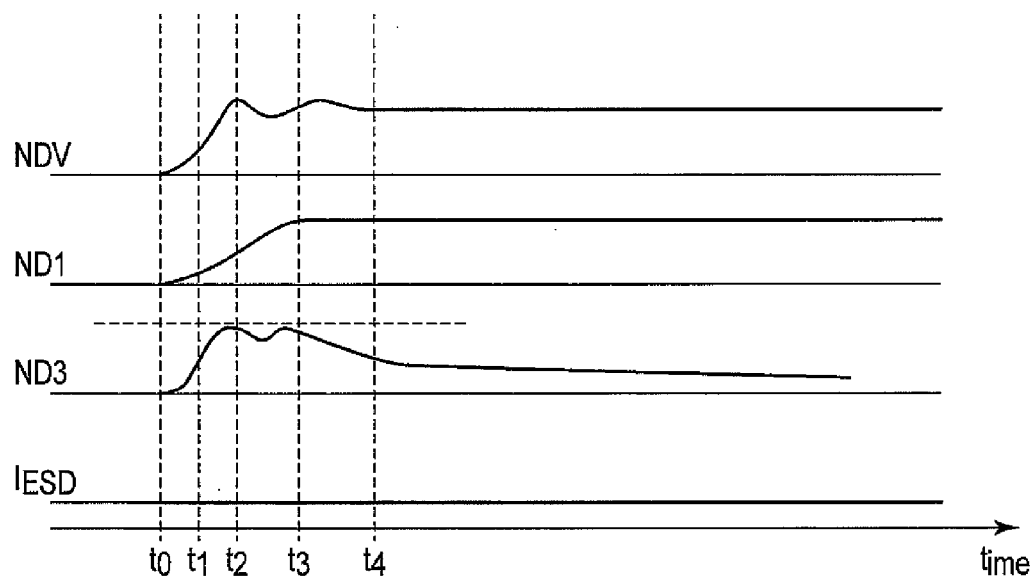
FIG. 13 is a waveform chart illustrating an operation example of the ESD protection circuit of the second embodiment.

Operation of the power supply circuit including the ESD protection circuit according to the second embodiment is described FIGS. 11 through 13. In the second embodiment, a description about operations substantially the same as the first embodiment is made as necessary.

FIG. 11 illustrates a waveform chart for describing operation of the ESD protection circuit in the power supply circuit of the present embodiment at the time of application of an ESD pulse. In FIG. 11, the horizontal axis of the waveform chart corresponds to time, and the vertical axis of the waveform chart corresponds to voltage values (or current values).

FIG. 11 illustrates changes in the potential of each node ND1, ND4 of the power supply clamp circuit of the ESD protection circuit according to a change in time, in which, in regard to a current $I_{ESD}$ which flows through the inside of the current path circuit, the horizontal axis of the waveform chart correspond to time and the vertical direction of the waveform chart corresponds to current values.

As described above, node ND1 is a connection point between resistor element R1 and capacitor element C1. Node ND4 is a connection node in the current path circuit 110, and a connection node ND4 between an end of the current path of P-type MOS transistor PT1 and the anode of diode DI1. In the present embodiment, a potential of the connection node ND1 of a delay circuit DC is directly applied to the gate of P-type MOS transistor PT1 serving as a controlling element of the current path circuit 110.

As illustrated in FIG. 11, at the time of performing an ESD test, or at the time of occurrence of ESD, at timing of time t0, an ESD pulse of a steep pulse form is applied to an I/O pad 35A, and a potential of node ND1 rises at belated timing as compared with the potential of the power supply line NDV because the potential of node N1 is pulled down to the ground potential by capacitor element C1 capacitively coupled to the ground line and node N1 is connected to the power supply line NDV via resistor element R1.

When the potential of node ND1 is less than or equal to the threshold voltage of P-type MOS transistor PT1 of the current path circuit 110, P-type MOS transistor PT1 of the current path circuit 110 is turned on.

At time t2, if a potential of the connection node ND4, connected between P-type MOS transistor PT1 and diode DI1, which is applied from the power supply line NDV (31A) rises up to a potential higher than a threshold voltage Vfd of a diode string DI1, DI2, the current path circuit 110 starts operating. As a result, an ESD current $I_{ESD}$ flows to the ground line NDG from the power supply line NDV by the current path circuit 110 being in ON state during a period from time t2 until a time when the potential of node ND4 reaches a level less than or equal to the threshold voltage Vfd of the diode string DI1, DI2.

In order to secure the period of time during which the ESD current $I_{ESD}$ can flow from the power supply line NDV to the ground line NDG via the current path circuit 110, the period in which the ON state of P-type MOS transistor PT1 can be maintained is set with a RC time constant which is based on resistor element and capacitor element of the delay circuit DC.

In this way, since the current path circuit 110 enables the current $I_{ESD}$ to flow from the power supply line NDV to the ground line NDG, the rise of the potential of the power supply line NDV is suppressed.

The potential of node ND1 rises slowly. When the potential of node ND1 reaches a level higher than the threshold voltage of P-type MOS transistor PT1, P-type MOS transistor PT1 is turned off.

Accordingly the current path circuit 110 is turned off, the current path from the power supply line NDV to the ground NDG enters OFF state, and the current path circuit 110 is blocked.

For example, the resistance value of resistor element R1 and the capacitance value of capacitor element C1 are suitably set so as not to cause the following state: the potential of node ND1 becomes greater than or equal to the threshold voltage of P-type MOS transistor PT1 before the potential of node ND4 rises by the ESD pulse and hence P-type MOS transistor PT1 is turned off.

In this way, at the time of occurrence of the ESD in a semiconductor circuit, the ESD pulse can be discharged to the ground line NDG by the ESD protection circuit 1 of the present embodiment, so that the internal circuit 2 connected to the power supply line and the ground line in the same manner as the ESD protection circuit 1 of the present embodiment can be protected from ESD.

Operation of the ESD protection circuit at the time of normal power-on is described with reference to FIG. 12.

FIG. 12 illustrates a waveform chart for describing operation of the ESD protection circuit of the present embodiment when a power supply voltage with a regular rising speed is supplied to a semiconductor circuit.

In FIG. 12, the horizontal axis of the waveform chart corresponds to time, and the vertical axis of the waveform chart corresponds to voltage values (or current values). FIG. 12 illustrates changes in the potential of each of nodes ND1 and ND4 of the power supply clamp circuit of the ESD protection circuit, according to change in time.

As illustrated in FIG. 12, at the time of power-on with a power supply voltage with a slow voltage rising speed, the potential of the power supply line NDV rises over a period of time which is longer than a delay time which is set in the timing control circuit 111A of the power supply clamp circuit 11.

The potential of node ND1 rises at substantially the same speed/timing as the power supply line NDV.

Since the potential of node ND4 is less than or equal to the threshold voltage of the diode string DI1, DI2, the current which flows to the ground line NDG from the power supply line NDV via the diode string DI1, DI2 does not nearly occur.

Therefore, at the time of power-on with a power supply voltage rising at a normal speed, P-type MOS transistor PT1 of the current path circuit 110 remains in the OFF state. As the result, the power supply line NDV and the ground line NDG are electrically isolated from each other by the current path circuit 110 being in the OFF state, so that a current leakage from the power supply line NDV to the ground line NDG does not occur.

Operation of the ESD protection circuit of the present embodiment at the time of power-on with a power supply voltage, in which a voltage rises steeply, is described with reference to FIG. 13. FIG. 13 illustrates a waveform chart for describing operation of the ESD protection circuit of the present embodiment when a power supply voltage with a steep voltage rising speed is supplied to a semiconductor circuit.

In FIG. 13, the horizontal axis of the waveform chart corresponds to time, and the vertical axis of the waveform chart corresponds to voltage values (or current values). FIG. 13 illustrates changes in the potential of each of nodes ND1 and ND4 of the power supply clamp circuit of the ESD protection circuit, according to change in time.

As illustrated in FIG. 13, when the power supply voltage is supplied, the potential of the power supply line NDV rises as a power supply voltage VDD with a steeply rising waveform like the ESD pulse is supplied at timing of time t0.

When the power supply voltage VDD with a steep rising is supplied, within a period from time t0 to time t1, the potential of nodes ND1 and ND4 change in the substantially same manner as when the ESD pulse is applied, and each circuit is driven in the substantially same manner as when the ESD pulse is applied.

At time t2, since the potential of node ND4 connected to the power supply line NDV via P-type MOS transistor PT1 in the current path circuit 110 is set to a voltage lower than the threshold of diode string DI1, DI2, diode string DI1, DI2 do not allow the flow of current and the current path circuit 110 is not turned on.

Subsequently, over a period from time t3 to time t4, with charging up of node ND1 of the RC circuit, the P-type MOS transistor PT1 is turned off and the current path circuit 110 is turned off. Thus, the power supply line NDV and ground line NDG are electrically isolated from each other by the current path circuit 110 being in the OFF state.

As illustrated in FIGS. 12 and 13, at the time of power-on, malfunctioning of the ESD protection circuit is prevented by the power supply circuit including the ESD protection circuit of the present embodiment, and the leakage current between the power supply line and the ground line, which passes through the ESD protection circuit (current path circuit), is suppressed.

(c) Modification

Modifications of the power supply circuit including the ESD protection circuit according to the second embodiment are described with reference to FIGS. 14 through 16.

Figure 14:
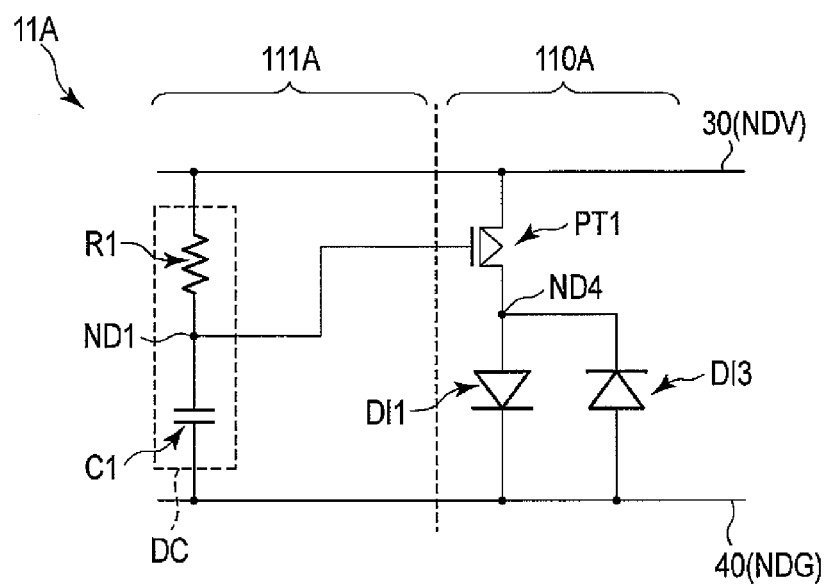
FIG. 14 is an equivalent circuit diagram illustrating a modification of the ESD protection circuit of the second embodiment.

FIGS. 14 through 16 are equivalent circuit diagrams illustrating modifications of the ESD protection circuit in the power supply circuit of the present embodiment.

As illustrated in FIG. 14, in a current path circuit 110A of an ESD protection circuit of the present embodiment, one diode DI1 is connected, via a current path of a P-type MOS transistor PT1, between a power supply line 31A and a ground line 32A like the circuit illustrated in FIG. 6.

As illustrated in FIG. 15, in a current path circuit 110B, a diode DI3 which sends a current from the ground line 32A to the power supply line 31A at the time of occurrence of ESD is directly connected between the power supply line 31A and the ground line 32A, without intervention of P-type MOS transistor PT1.

When there is only one diode DI1 which is connected between the power supply line 31A and the ground line 32A via the current path of P-type MOS transistor PT1 like the current path circuit 110C illustrated in FIG. 16, diode DI3 which sends a current to the power supply line 31A from the ground line 32A at the time of occurrence of the ESD is directly connected between the power supply line 31A and the ground line 32A.

As described above, as illustrated in FIGS. 14 through 16, even though the current path circuits 110A, 110B, and 110C differ in an internal configuration (for example, diodes) from the current path circuit of the power supply clamp circuit illustrated in FIG. 9, the ESD protection circuit in the power supply circuit which includes the power supply clamp circuit illustrated in FIGS. 14 through 16 can acquire the same effect as the ESD protection circuit including the power supply clamp circuit of FIG. 10.

(d) Conclusion

By using the power supply circuit including the ESD protection circuit of the second embodiment, the same effect described in the first embodiment also can be acquired.

As described above, a plurality of inverters in the timing control circuit of the power supply clamp circuit 11 is removed from the ESD protection of the present embodiment. And in the power supply clamp circuit 11, the gate of a P-type MOS transistor PT1 as a controlling element of the current path circuit 110A is directly connected to a connection node ND1 of a resistor element R1 and a capacitor element C1 of a timing control circuit 111A.

So, according to the ESD protection circuit of the present embodiment, the number of elements of the ESD protection circuit may be reduced. As the result, a parasitic resistance and parasitic capacitance of interconnect to which the ESD protection circuit is connected can be reduced, and a stable operation and a high-speed operation of a semiconductor circuit can be achieved.

In addition, according to the ESD protection circuit of the present embodiment, the area of the ESD protection circuit on a chip can be reduced, and the chip cost of a semiconductor circuit can be reduced.

(3) Application Examples

Application examples of the power supply circuit including the ESD protection circuit according to the first and second embodiments are described with reference to FIGS. 17 through 24.

(a) Example of Layout

FIG. 17 illustrates an example of a chip layout of a semiconductor memory including the ESD protection circuit and the power supply circuit of the present embodiment.

As illustrated in FIG. 17, the ESD protection circuit 1 of the first or second embodiment is applied to a semiconductor memory serving as the semiconductor circuit.

As illustrated in FIG. 17, pads 31B, 32B, 35, and 39 of a semiconductor memory 900 are arranged along with two opposing sides (hereinafter, referred to as an upper side and a lower side) of a chip (semiconductor substrate) 9 in a direction parallel to the surface of the chip 9.

A power supply pad 31B for a power supply voltage VDD and a ground pad 32B for a ground voltage VSS are provided in the upper side and the lower side of the chip 9, respectively.

For example, three or more power supply pads 31B are arranged in each side of the upper side and lower side of the chip 9. Three or more ground pads 32B are arranged in each side of the upper side and lower side of the chip 9.

In the upper side of the chip 9, a control or test pad and address pads are arrayed between two neighboring ground pads 32B along a direction in which the upper side extends. In the lower side of the chip 9, I/O pads 35B and I/O circuit (input/output circuit) arrangement areas 35 are arrayed between two neighboring ground pads 32B along a direction in which the lower side extends.

Hereinbelow, a region in which the pad is provided on the chip 9 of the semiconductor circuit 900 is called a pad region 3.

In regarding to the arrangement of the power supply clamp circuit and the ESD protection circuit in the power supply circuit, it is preferable that arrangement positions of the ESD clamp circuit and each of circuit regions in the chip, and the number of the power supply clamp circuits in the chip can be suitably set based on setting conditions of the ESD resistance of a target circuit to be protected from the ESD and process parameters.

In the chip 9, the power supply clamp circuit 11 included in the ESD protection circuit 1 of the present embodiment is arranged in the upper side of the chip 9, in a region between the power supply pad 31B and the ground pad 32B which adjoin in the direction in which the upper side of the chip 9 extends. In addition, in the chip 9, the power supply clamp circuit 11 is arranged in the lower side of the chip 9, in a region between the power supply pad 31B and the ground pad 32B which adjoin in the direction in which the lower side of chip 9 extends.

Hereinbelow, a region, on the chip 9 of the semiconductor circuit 900, in which the ESD protection circuit 1 (power supply clamp circuit 11) is provided is referred to as a protection circuit region.

The internal circuit (hereinafter, referred to as semiconductor memory) as a protection target of the ESD protection circuit 1 is provided in the chip 9.

A semiconductor memory 2 which is protected from ESD by the ESD protection circuit in the power supply circuit of the present embodiment is a resistance-change memory.

As illustrated in FIG. 17, a memory cell array 20 of the resistance-change memory 2 is arranged in the chip 9. A peripheral circuit 29 is arranged in a region between the arrangement region of the pads 31B, 32B, and 39 in the upper side of the chip 9, and the memory cell array 20. Another peripheral circuit 29 is arranged in a region between the arrangement region of the pads 31B, 32B, and 39 in the lower side of the chip 9, and the memory cell array 20. Hereinbelow, a region in which the memory cell array 20 is provided is also referred to as a memory cell array region 20. In addition, the regions in which the peripheral circuits 29 are provided are also referred to as peripheral circuit regions 29 or peripheral regions 29.

FIG. 18 is a schematic diagram illustrating circuit configurations of the memory cell array and peripheral circuits of the resistance-change memory.

As illustrated in FIG. 18, the memory cell array 20 of the resistance-change memory includes a plurality of memory cells MC. The memory cells MC are arranged in a matrix form in the memory cell array 20. In the memory cell array 20, a plurality of bit lines BL and bBL and a plurality of word lines WL are provided. The Bit lines BL and bBL extend in an X-direction (column direction), and the word lines WL extend in a Y-direction (row direction). Two bit lines BL and bBL forms one pair of bit lines.

The memory cells MC are connected to the bit lines BL and bBL, and the word lines WL.

The memory cells MC arranged in the X-direction are connected to a common bit line pair BL and bBL. The memory cells MC arranged in the Y-direction are connected to the common word line WL.

Each memory cell MC includes one memory element 200 and one selection element 220, for example.

As described above, the memory element 200 is a resistance-change element 200.

The selecting switch 220 is a field effect transistor (Field Effect Transistor), for example. Hereinbelow, the field effect transistor as a selecting switch 220 is referred to as a select transistor 220. The resistance-change element 200 is selected as an object of operation by the select transistor 220 being in an ON state, and the resistance-change element 200 is switched to a non-selection state by the select transistor 220 being in an OFF state.

One end of the resistance-change element 200 is connected to the bit line BL, and the other end of the resistance-change element 1 is connected to one end (source/drain) of the current path of the select transistor 220. The other end (drain/source) of the current path of the select transistor 220 is connected to the bit line bBL. A control terminal (gate) of the select transistor 220 is connected to the word line WL.

In FIG. 18, the memory cell including one memory element and one select transistor is illustrated. However, two or more memory elements (resistance-change element) may be provided in one memory cell, and two or more select transistors may be provided in one memory cell.

Column control circuits 291A and 291B as the peripheral circuit 29 control columns of the memory cell array 20. The column control circuits 291A and 291B are connected to one end and the other end of each of the bit lines BL and bBL, respectively. The column control circuits 291A and 291B control activation/deactivation of the bit lines BL and bBL based on address signals supplied from the outside.

A row control circuit 292 as the peripheral circuit 29 control rows of the memory cell array 20. The row control circuit 292 is connected to one ends of the word lines WL. The row control circuit 292 controls activation/deactivation of the word lines WL and based on address signals supplied from the outside.

The memory cells activated (selected) by the column control circuits 291A and 291B and the row control circuit 292 are accessed from the outside (a memory controller or a host) as the memory cells which are objects of operation (hereinafter, referred to as selection cells).

Write circuits 293A and 293B are connected to one end and the other end of each of the bit lines BL and bBL via column control circuits 291A and 291B, respectively. Each of the write circuits 293A and 293B includes a source circuit such as a current source or a voltage source for generating a current or a voltage which changes the resistance state of the resistance-change element 200, and a sink circuit for absorbing the current.

A read circuit 294 is connected to one ends of the bit lines BL and bBL via the column control circuit 291A. The read circuit 294 includes a current source or a voltage source that generates a current for determining the resistance state of the resistance-change element 200, a sense amplifier which detects and amplifies a signal read (a current/voltage changed), and a latch circuit that temporarily holds data.

The row control circuit 292, the column control circuits 291A and 291B, the write circuits 293A and 293B, and the read circuit 294 are provided in the peripheral circuit region 29 of the chip 9.

For example, a buffer circuit, a state machine (control circuit), or an ECC (Error Checking and Correcting) circuit, etc. may be provided in the chip as the peripheral circuit 29. In addition, a logic circuit having a predetermined function may be provided in the same chip as the resistance-change memory so that a system LSI including the resistance-change memory and the logic circuit may be formed.

The resistance-change memory having these circuits serves as a protection target circuit which is to be protected from ESD by the ESD protection circuit including the power supply clamp circuit described in the embodiments.

For example, the MOS transistors in the power supply clamp circuit 11 of the ESD protection circuit are formed by substantially the same processes as select transistors 220 of a memory array and/or the MOS transistors of the peripheral circuits 29 such as MOS transistors in the row/column control circuits 292, 291A and 291B.

FIG. 19 is a plan view illustrating an example of the layout of the power supply clamp circuit included in the ESD protection circuit of the present embodiment. The layout of the power supply clamp circuit illustrated in FIG. 19 corresponds to the power supply clamp circuit having the circuit configuration illustrated in FIG. 6.

As illustrated in FIG. 19, each component of the power supply clamp circuit 11 is provided near the power supply pad (or ground pad), and is provided in a region under the power supply line 31A and the ground line 32A in a direction perpendicular to the surface of the chip (semiconductor substrate) 9.

The power supply line 31A and the ground line 32A are provided in an interconnect level of a top layer. In addition, the interconnect level represents a position of the interconnect (and an interlayer insulation film) from the surface of a semiconductor substrate as a reference position in a direction perpendicular to the surface of the semiconductor substrate.

For example, a formation region (hereinafter, referred to as resistor-forming region) RR in which resistor element R1 of the delay circuit (RC circuit) of the timing control circuit 111 is formed is provided under the power supply line 31A. A formation region (hereinafter, referred to as capacitor-forming region) CR in which capacitor element C1, constituting the delay circuit of the timing control circuit 111, is formed is provided under the ground line 32A.

In addition, a formation area (hereinafter, referred to as inverter-forming region) IVR in which the inverter circuit IVC of the timing control circuit 111 is formed is provided under the power supply line 31A and the ground line 32A, for example.

Formation regions (hereinafter, referred to as diode-forming regions) DIR1 and DIR3 in which diodes DI1 and DI3 of the current path circuit 110 are formed are provided on at least one side of the power supply line 31A and the ground line 32A, for example.

Since a formation region (hereinafter, referred to as P-type MOS transistor-forming region) PTR, in which P-type MOS transistor PT1 of the current path circuit 110 is formed, is provided in a region other than underside positions of the power supply line and the ground line, on the chip 9, because the elements have a large size.

For example, the P-type MOS transistor-forming region PTR is arranged in the chip 9 so as to be adjacent to the region, in which the power supply pad 31B is formed, in a direction parallel to an extension direction of the power supply line 31A, when viewed from a direction perpendicular to the surface of the chip. In addition, the P-type MOS transistor-forming region PTR is arranged in the chip 9 such as to be adjacent to the power supply line 31A, in a direction orthogonal to the extension direction of the power supply line, when viewed from the direction perpendicular to the surface of the chip.

In this way, the power supply clamp circuit included in the ESD protection circuit 1 in the power supply circuit of the present embodiment is provided within a region of L1×W1, i.e., a region near the power supply pad and the power supply line/ground line.

Thus, since the power supply clamp circuit 110 included in the ESD protection circuit in the power supply circuit of the present embodiment is provided under the power supply line 31A and the ground line 32A, it is possible to suppress the power supply circuit including the ESD protection circuit 1 of the present embodiment from dominating the region for forming the internal circuit 2 in the chip, and suppress the chip size of the semiconductor circuit including the ESD protection circuit (power supply circuit) from increasing.

In addition, since the power supply clamp circuit 110 included in the ESD protection circuit 1 of the present embodiment is arranged near the power supply and ground pads and the power supply and ground lines 32A, it is easy to arrange the interconnection in the chip.

(b) Example of Structure

An example of the structure of the power supply clamp circuit included in the ESD protection circuit in the power supply circuit of the present embodiment is described with reference to FIGS. 20 and 21.

Figure 20:
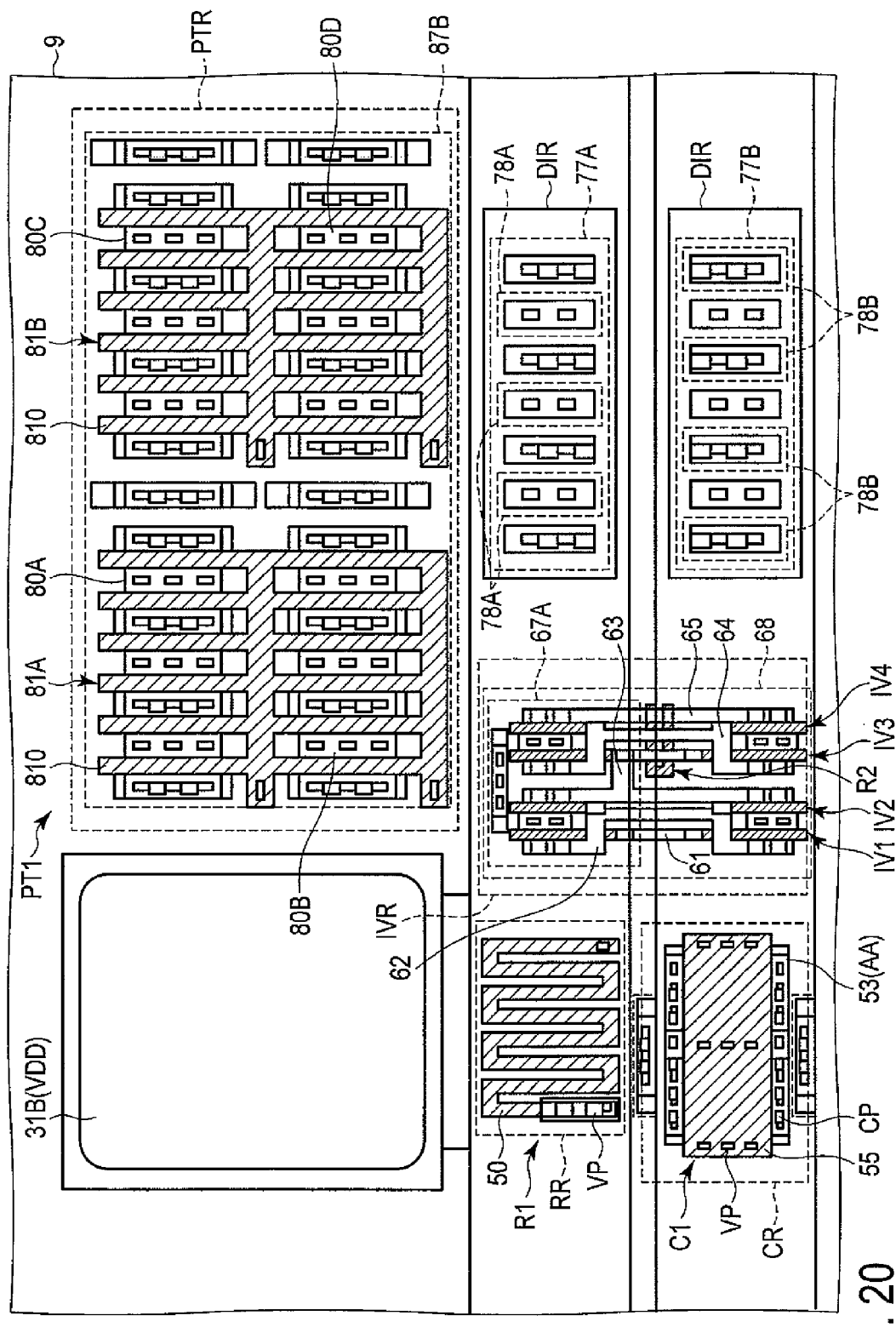
FIG. 20 is a diagram for describing an application example of the ESD protection circuit of one embodiment.

FIG. 20 is a plan view illustrating an example of a planar structure of the power supply clamp circuit included in the ESD protection circuit of the present embodiment. The plane layout illustrated in FIG. 20 corresponds to an internal configuration of the power supply clamp circuit illustrated in FIG. 6.

As illustrated in FIG. 20, each component of the power supply clamp circuit 11 is provided near the power supply pad (or the ground pad), and is provided in a region under the power supply line 31A and the ground line 32A in a direction perpendicular to the surface of the chip (semiconductor substrate).

For example, resistor element R1 of the delay circuit (RC circuit) of the timing control circuit 111 is formed using a polysilicon layer 50. The polysilicon layer (resistive layer) 50 of resistor element R1 is formed by the same process, using the same material as the gate electrode of the MOS transistor.

Resistor element R1 having a predetermined resistance value is formed by controlling the length of the polysilicon layer 50. Therefore, the polysilicon layer 50 of resistor element R1 is formed in a folded-back structure in the resistor-forming region RR. On the polysilicon layer 50, a plug VP as a terminal of resistor element R1 is provided.

In addition, resistor element R1 may be formed using a diffusion layer of a semiconductor substrate.

For example, capacitor element C1 of the delay circuit of the timing control circuit 111 is a MOS capacitor. Capacitor element C1 formed from a MOS capacitors is formed in a MOS structure including a semiconductor region (active region) 53 provided in the capacitor-forming region CR, an insulation film (not illustrated) on the semiconductor region, and an electrode (capacitor electrode) 55 on the insulation film.

Capacitor element (MOS capacitors) C1 having a predetermined capacitance value is formed by controlling a size of an area where the capacitor electrode 55 and the semiconductor region 53 face each other.

The capacitor electrode 55 is formed by the same process, using the same material as the gate electrode of the MOS transistor. Plugs CP and VP as terminals of capacitor element C1 are provided on the diffusion layer provided in the semiconductor region 53 and on the capacitor electrode 55 of the MOS capacitor C1, respectively.

In addition, inverters IV1, IV2, IV3, and IV4 of a predetermined number of stages, and resistor element R2 are formed in the inverter-forming region IVR.

The P-type MOS transistors which constitute inverters IV1, IV2, IV3, and IV4, respectively are formed in a N-type well region 67A of the inverter-forming region IVR. The N-type MOS transistors which constitute inverters IV1, IV2, IV3, and IV4, respectively are formed in a P-type semiconductor substrate or a P-type well region 68 in the inverter-forming region IVR. Resistor element R2 is formed by the same process, using the same material as resistor element R1.

By connecting gate electrodes of the P- and N-type MOS transistors to each other by using interconnects and plugs in an interlayer insulation film, the input/output nodes 61, 62, 63, 64, and 65 of inverters IV1, IV2, IV3, and IV4 connected in series with each other are formed.

In addition, the output node 65 of inverter IV4 of the last stage is formed by connecting the drain of the P-type MO transistor and the drain of the N-type MOS transistor to resistor element R2 of the polysilicon layer via the interconnect and plug in the interlayer insulation film.

P-type MOS transistor PT1 in the current path circuit 110 has gate electrodes 81A and 81B of a comb-like plane shape. In the example illustrated in FIG. 20, P-type MOS transistor PT1 has two gate electrodes of a comb shape. One gate electrode 81A is provided in two active regions 80A and 80B, and the other gate electrode 81B is provided in two active regions 80C and 80D. The two gate electrodes 81A and 81B are connected by the interconnect and plug.

Each of the gate electrodes 81A and 81B includes a plurality of gate fingers 810. The gate fingers 810 are provided above the active regions 80A, 80B, and 80C and 80D with a gate insulating film (not illustrated) formed therebetween.

The source/drain of P-type MOS transistor PT1 are P-type diffusion layers provided in N-type well region 87A (the active regions 80A, 80B, 80C, and 80D) of the P-type MOS transistor-forming region PTR.

Since the gate electrode of P-type MOS transistor PT1 has a comb shape in a plan shape, the effective channel width and the size of the channel length of P-type MOS transistor PT1 are controlled, and P-type MOS transistor PT1 is formed to have a predetermined drive capability and breakdown voltage.

Each transistor in the ESD protection circuit is formed by substantially the same process, using substantially the same material as the transistors of the peripheral circuit of the semiconductor memory (herein, referred to as a resistance-change memory).

Diode DI1 in the current path circuit 110 includes an N-type well region 77A in the diode-forming region DIR1, and a plurality of P-type diffusion layer regions 78A in N-type well region 77A. N-type well region 77A and the P-type diffusion layer regions 78A are connected to each other by the interconnects and plugs in the interlayer insulation film, forming one diode DI1.

Diode DI3 in the current path circuit 110 includes an N-type well region 77B in the diode-forming region DIR1, and a plurality of P-type diffusion layer regions 78B in N-type well region 77B. N-type well region 77B and the P-type diffusion layer regions 78B are connected to each other by the interconnects and plugs in the interlayer insulation film, forming one diodes DI3.

Figure 21:
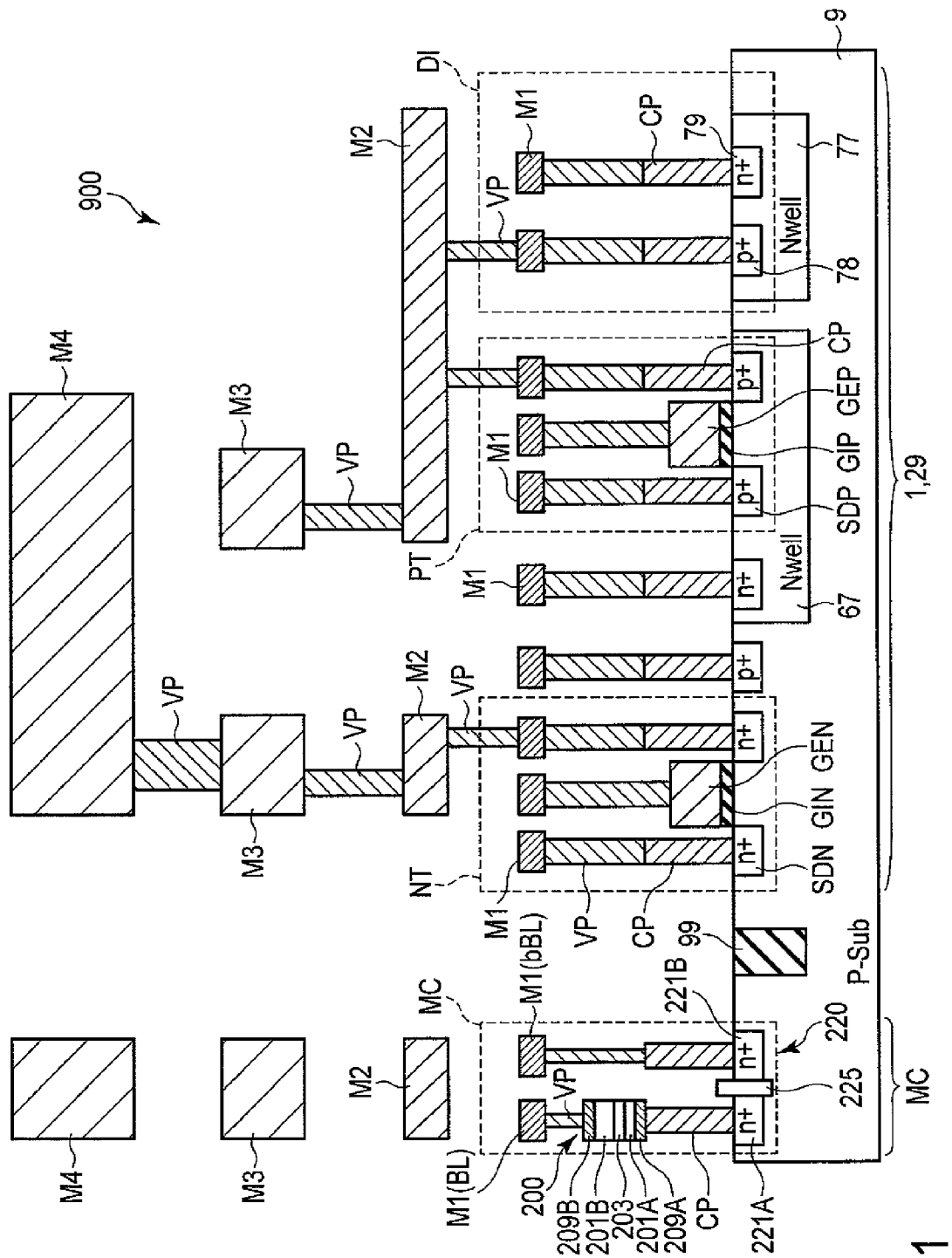
FIG. 21 is a diagram for describing an application example of the ESD protection circuit of one embodiment.

FIG. 21 is a sectional view illustrating an example of the sectional structure of the power supply clamp circuit included in the ESD protection circuit of the present embodiment.

In FIG. 21, a part of each component of the power supply clamp circuit and a part of each constituent of the memory cell of the memory cell array are illustrated. In FIG. 21, illustration of the interlayer insulation film which covers the surface of a semiconductor substrate is omitted for simplification of illustration.

As illustrated in FIG. 21, each element in the ESD protection circuit 1 is provided in a region adjacent to a resistance-change memory cell array and a peripheral circuit thereof.

The memory cell MC of the resistance-change memory is formed in the active region of the semiconductor substrate 9. The active region in which the memory cell MC is provided is divided by an insulator layer 99 embedded in an element isolation region of the semiconductor substrate 9.

An upper end of the memory element (resistance-change element) 200 is connected to the bit line BL via the upper electrode 209B and the plug VP. A lower end of the memory element 200 is connected to a source/drain diffusion layer 221A of the select transistor 220 via the lower electrode 209A and contact plug CP. The source/drain diffusion layer 221B of the select transistor 220 is connected to the bit line bBL via a plurality of plugs.

A gate electrode 225 is embedded in the active region provided between two source/drain diffusion layers 221A and 221B of the select transistor 220 via a gate insulation film (not illustrated). When the select transistor 220 has a structure (embedded gate structure) in which the gate electrode 225 is embedded in the semiconductor substrate 9, it is possible to miniaturize the transistor 220 and the memory cell, while securing the drive capability of the transistor.

For example, the gate electrode 225 extends in a row direction, and is used as the word line WL.

In addition, a field effect transistor of a planar structure, FinFET, etc. may be used as the select transistor 220.

In FIG. 21, two bit lines BL and bBL which constitute a bit line pair are formed using interconnects (metal layer) M1 provided in the same interconnect level. However, the bit lines BL and bBL constituting a bit line pair may be provided in mutually different interconnect levels.

When the semiconductor memory protected by the ESD protection circuit is an MRAM, a magnetoresistance effect element is used for the resistance-change element serving as a memory element.

A magnetoresistance effect element 200 as the memory element (resistance-change element) 200 is a MTJ element 200 having a magnetic tunnel junction.

The MTJ element 200 includes two magnetic layers 201A and 201B and a non-magnetic layer (hereinafter, referred to as tunnel barrier layer) 203 interposed between the two magnetic layers 201A and 201B at least.

Direction of the magnetization of one magnetic layer among the two magnetic layers 201A and 201B included in the MTJ element 200 is variable, and the direction of the magnetization of the other magnetic layer is fixed (invariable). The magnetic layer in which the direction of the magnetization is variable is called a storage layer, a recording layer, a free layer, or a magnetic free layer. The magnetic layer in which the direction of the magnetization is fixed is called a reference layer, a pin layer, a pinned layer, a fixed layer, a fixing layer, or a magnetic invariable layer.

In the MTJ element 200, the resistance state (resistance value) of an element changes according to the relative relation in the directions of magnetization of the two magnetic layers 201A and 201B. When the magnetization arrangement of the MTJ element 200 is parallel arrangement (parallel state), the resistance value of the MTJ element 200 becomes the smallest. When the magnetization arrangement of the MTJ element 200 is anti-parallel arrangement (anti-parallel state), the resistance value of the MTJ element 200 becomes the largest. By assigning data (0 or 1) to be stored to each of two or more resistance states, respectively, the MTJ element 200 is used as a memory element which stores data of 1 bit or more.

Although the MTJ element 200 is provided directly above the plug CP, it may be arranged in a position shifted from the directly above the contact plug (for example, arranged in a position above the gate electrode of the select transistor) using an intermediate interconnect layer.

When an MTJ element is used for the resistance-change memory element 200 like this application example, data writing (i.e., changing the resistance state of the MTJ element) with respect to the memory element 200 is, for example, executed by a spin injection magnetization reversal method (Spin-Transfer Torque, hereinafter, referred to as STT). That is, in the MTJ element 200 as a memory element, the relative direction of magnetization between the storage layer and the reference layer is reversed by the STT.

In an STT-MRAM, at the time of writing data, a write current from the write circuits 293A and 293B of FIG. 18 is supplied to the MTJ element 200 of a selection cell as a write target. The write current which flows to the bit line bBL from the bit line BL or the write current which flows to the bit line BL from the bit line bBL is output to the MTJ element 200 from the write circuits 293A and 293B according to the write data.

Data reading (i.e., determining the resistance state) with respect to the MTJ element 200 as a memory element is performed by sending a current through the MTJ element 200. The current value of a read current for reading the data of the MTJ element 200 (for determining the resistance state) is set to a value smaller than the current value (magnetization reversal threshold) of the write current so that magnetization of the storage layer may not be reversed by the read current. In this way, it is determined whether the MTJ element 1 is in a state of holding data "0" (for example, the parallel state, or the low resistance state) or in a state of holding data "1" (for example, the anti-parallel state or the high resistance state).

For example, the power supply line 31A and ground line 32A are formed using a metal layer M4 provided in the interconnect level of the top layer.

Each element (for example, MOS transistor) of the peripheral circuit, i.e., each element PT, NT, DI of the power supply clamp circuit of the ESD protection circuit of the present embodiment is provided on the semiconductor substrate 9.

For example, the P-type MOS transistors PT in the peripheral circuit, the current path circuit 110, and the inverter circuit IVC are provided in N-type well region 67. In addition, the N-type MOS transistors NT in the peripheral circuit and the inverter circuit IVC are provided in the P-type well region or the P-type semiconductor substrate 9.

Each transistor PT, NT has a planar-structure gate electrode GEP, GEN. The gate electrodes GEP and GEN of the transistors PT and NT are provided on the semiconductor substrate (active region) via the gate insulation films GIP and GIN, respectively. The P-type MOS transistor PT includes source/drain regions SDP formed from P-type diffusion layers provided in the N-type well region. The N-type MOS transistor NT includes source/drain regions SDN formed from N-type diffusion layers provided in the P-type well region or the P-type semiconductor substrate 9.

The diode DI is formed from N-type well region 77 and one or more P-type diffusion layers 78 provided in N-type well region 77. For example, the N-type ($N^+$ type) diffusion layer 79 may be provided in a contact region between N-type well region 77 and the contact plug CP. By this, the contact resistance between N-type well region 77 and the contact plug CP can be reduced.

As illustrated in FIG. 21, the transistors PT and NT and the diode DI are connected to each other by a plurality of interconnects M1, M2, M3, and M4 provided in corresponding interconnect levels and via the plugs CP and VP provided in interlayer insulation films (not illustrated). By this, the current path circuit 110 and the timing control circuit 111 included in the power supply clamp circuit 11 of the ESD protection circuit of the present embodiment are formed.

(c) Design Example

A design example of the ESD protection circuit in the power supply circuit of the present embodiment is described.

The design example of each element of the current path circuit and the timing control circuit of the power supply clamp circuit in the ESD protection circuit of the present embodiment is described by suitably using FIGS. 17 through 21.

For example, next described is the designed value of each element in the power supply clamp circuit when the ESD protection circuit as a component of the power supply circuit of the present embodiment is applied to a semiconductor memory formed by a manufacturing process for an element size of about 40 to 50 nm. The design example described here corresponds to the internal configuration of the power supply clamp circuit of FIG. 6.

The power supply line 31A and the ground line 32A are arranged in a interconnect level of a top layer among multi-level interconnections, and are formed, for example, using the interconnect M4 of FIG. 21. The each line width of the power supply line 31A and ground line 32A is set to 30 µm.

As described above, the power supply clamp circuit 11 of the ESD protection circuit in the present embodiment includes the current path circuit 110 and the timing control circuit 111. As illustrated in FIGS. 19 and 20, the current path circuit 110 and timing control circuit 111 are arranged under the power supply line 31A and the ground line 32A, and in a region near the power supply line 31A and the ground line 32A.

In the delay circuit DC including resistor element R1 and capacitor element C1 of the timing control circuit 111, an RC time constant of the delay circuit DC is set to about 2 µsec. The value of this RC time constant is set according to a period (period during which P-type MOS transistor PT1 remains in the ON state) during which P-type MOS transistor PT1 of the current path circuit 110 allows the flow of a current to the ground line 32A from the power supply line 31A, when the ESD pulse is applied.

When the RC time constant of the delay circuit R1 and C1 is excessively small and when the ESD pulse is applied, P-type MOS transistor PT1 of the current path circuit 110 will be turned off before the electric charge generated due to the ESD is completely transmitted between power supply line 31A and ground line 32A through the current path circuit 110. For this reason, the voltage in the chip 9 of the semiconductor circuit 900 may increase, and the internal circuit 2 which is a protection target is likely to be destructed.

When the RC time constant of the RC circuit R1 and C1 is excessively large, at the time of supplying power, a rush current is easy to occur, the power supply clamp circuit 11 may malfunction, and the semiconductor circuit 900 may undergo failure.

However, as described above, at the time of normal power supply, in the power supply clamp circuit 11 described in the present embodiment, since the forward voltage of diode DI1 is set to a level greater than or equal to the power supply voltage VDD, occurrence of the rush current is suppressed.

Therefore, when the ESD pulse is applied, the RC time constant may be set to a suitable value (here, 2 µsec) so that the surge current (ESD current) can be fully discharged.

The RC time constant is practically determined by the product of the resistance value of resistor element R1, and the capacitance value of capacitor element C1. For example, the resistance value Ra of resistor element R1 is set to 300 kΩ, and the capacitance value Ca of the capacitor element (MOS capacitor) is set to 6.7 pF so that the area of resistor element R1 and the area of the MOS capacitor as capacitor element C1 may be comparatively reduced.

In this case, in FIG. 18, the layout area of the forming region RR and CR of the resistor element and capacitor element which constitute the RC circuit is set to about 1300 µm².

Since three inverters IV1, IV2, and IV3 except the last stage of the timing control circuit unit 111 are designed as described below, in order to drive the large-size inverter IV4 of the last stage.

For example, a size ratio (surface ratio) of the P-type MOS transistor and the N-type MOS transistor is set to 2:1 so that the current drive capabilities of the P-type MOS transistor and the N-type MOS transistor of each of inverters IV1, IV2, and IV3 may become substantially equal to each other.

In regard to the sizes of the P-type MOS transistor and the N-type MOS transistor of inverter IV1 of a first stage, the channel width (gate width) of the P-type MOS transistor is set to 5 µm, and the channel width (gate width) of the N-type MOS transistor is set to 2.5 µm.

In regard to the sizes of the P-type MOS transistor and the N-type MOS transistor of inverter IV2 of a second stage, the channel width (gate width) of the P-type MOS transistor is set to 20 µm, and the channel width (gate width) of the N-type MOS transistor is set to 10 µm.

In regard to the sizes of the P-type MOS transistor and the N-type MOS transistor of inverter IV2 of a third stage, the channel width (gate width) of the P-type MOS transistor is set to 100 µm, and the channel width (gate width) of the N-type MOS transistor is set to 50 µm.

Inverter IV4 of the last stage includes P-type and N-type MOS transistors PT2 and NT1 forming the inverter, and resistor element R2 as described above.

As for inverter IV4 of the last stage, the size of each of the transistors PT2 and NT1 is designed so that a current drive capability ratio of P-type MOS transistor PT2 and N-type MOS transistor NT1 may be set to 1:10. In this case, the size ratio (area ratio) of P-type MOS transistor PT2 and N-type MOS transistor NT1 is set to 1:5.

For example, the channel width of P-type MOS transistor PT2 is set to 200 µm. The channel width of N-type MOS transistor NT1 is set to 1000 µm so that the current drive capability of N-type MOS transistor NT1 may become larger than the current drive capability of P-type MOS transistor PT2. By this, an output node ND3 of inverter IV4 of the last stage tends to be easily discharged, and the speed at which node ND3 is discharged to become the "L" level is faster than the speed at which node ND3 is charged to become the "H" level.

The resistance value of resistor element R2 connected in series between the drains of P-type MOS transistor PT2 and N-type MOS transistor NT1 is set to about 30 kΩ so that node ND3 may be slowly charged.

In this way, inverter IV4 whose "H" level response speed is slower than the "L" level response speed is formed. Therefore, while the potential of the power supply line 31A is rising, the potential of the output node ND3 of the inverter circuit IVC is slowly charged so that the potential of the output node ND3 may be easily pulled down to the ground potential VSS, by the settings of each of the transistors PT2 and NT1 and resistor element R2 in inverter IV4 of the last stage of the inverter circuit IVC.

In FIGS. 19 and 20, the area of the forming region IVR in which the inverter circuit IVC having the designed values of each element described here is formed is about 2000 µm².

In the current path circuit 110, the current path of P-type MOS transistor PT1 and the two diodes DI1 and DI3 cross-coupled to each other are connected in series. The size of P-type MOS transistor PT1 is set such that when the ESD pulse is applied, for example, when a pulse voltage of Mechanical Model (MM) which is 200V is applied, the breakdown voltage and the current drive capability which makes the surge current (ESD current) sufficiently flow from the power supply line 31A to the ground line 32A via the current path circuit 110 can be secured. When taking the designed size of the semiconductor memory and the design values of the timing control circuit 111 into consideration, the channel width of P-type MOS transistor PT1 having a comb-like gate electrode may be set to about 135000 μm.

As described above, diodes DI1 and DI3 of the current path circuit 110 are formed using the PN junction of the N-type well and the P-type diffusion layers. In this case, an edge length of the P-type diffusion layers of diodes DI1 and DI3 is set to about 400 μm.

In the chip, the layout area of the current path circuit 110 including P-type MOS transistor PT1 and diodes DI1 and DI3 having the designed values described above is about 11000 μm$^2$.

In the chip of the semiconductor memory formed using the manufacturing process for about 40 to 50 nm, each of the pads and the circuit regions of the ESD protection circuit are arranged such that a voltage greater than or equal to 7 V may not be applied to the gate insulating film (for example, a silicon oxide) of the transistors in the chip, and the distance from the I/O pad and the address pad to the power supply pad may be set to 3000 μm or less.

Based on the designed values of each element described above, an unit area (a unit layout size) including one power supply pad and one power supply clamp circuit will be set to L1×W1=200 μm×140 μm. In this unit area, the power supply clamp circuit connected to the power supply line and the ground line can be arranged.

(d) Modification

A modification of the semiconductor circuit including the ESD protection circuit in the power supply circuit of the present embodiment is described with reference to FIGS. 22 and 24.

Figure 22:
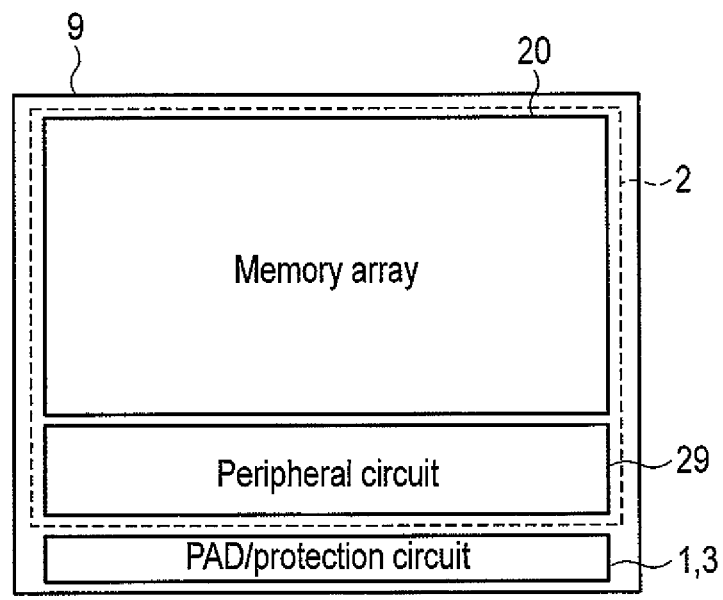
FIG. 22 is a diagram for describing an application example of the ESD protection circuit of one embodiment.
Figure 23:
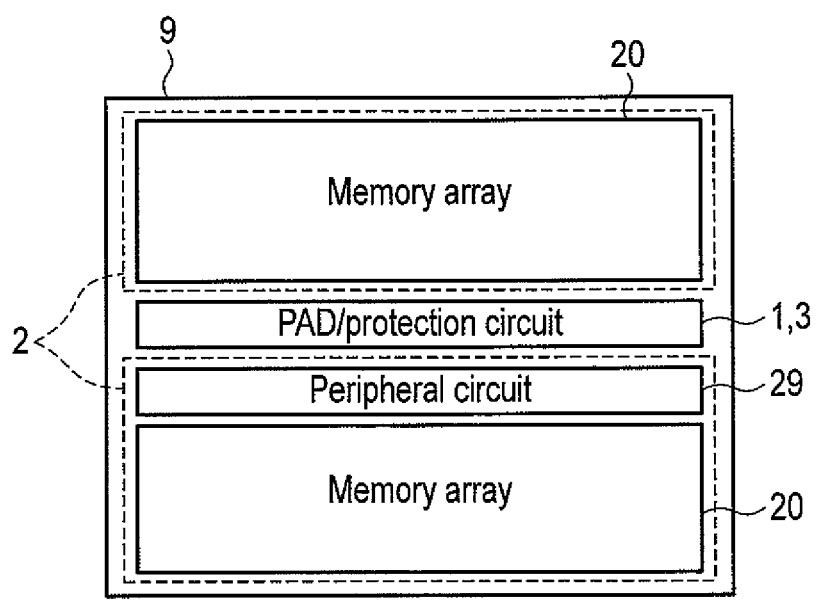
FIG. 23 is a diagram for describing an application example of the ESD protection circuit of one embodiment.

FIGS. 22 through 24 illustrate modifications of the chip layout of the semiconductor circuit including the ESD protection circuit of the embodiments.

The layout of the ESD protection circuit 1 in the power supply circuit of the present embodiment in the chip of the semiconductor circuit (for example, MRAM) is not limited to the layout example illustrated in FIG. 16.

As illustrated in FIG. 22, a protection circuit region 1 and a pad region 3 may be provided only in one side (lower side) of a chip including an internal circuit (for example, a semiconductor memory).

A memory cell array 20 of a semiconductor memory 2 is provided in a side (upper side), which is opposite to the side where the protection circuit region 1 and the pad region 3 are provided, on the chip 9. A peripheral circuit region 29 is arranged between the memory cell array 20 and the protection circuit region 1, on the chip 9.

As illustrated in FIG. 23, two memory cell arrays 20 may be provided in one chip 9. The two memory cell arrays 20 are provided in an upper side and a lower side of the chip 9, respectively. A protection circuit region 1, a pad region 3, and a peripheral circuit region 29 are provided between the two memory cell arrays 20. The protection circuit region 1 and the pad region 3 are arranged in the chip 9 such as to be adjacent to the memory cell array 20 disposed in the upper side of the chip 9. The peripheral circuit region 29 is arranged in the chip 9 such as to be adjacent to the memory cell array 20 disposed in the lower side of the chip.

As illustrated in FIG. 24, not only two memory cell arrays 20 are provided in the chip 9, but also two pad regions 3 and two protection circuit regions 1 may be provided in one chip 9.

The peripheral circuit region 29 is arranged in the center of the chip 9 such as to be interposed between the two memory cell arrays 20 in the width direction of the chip 9.

One pad/protection circuit region 3 and 1 are arranged between one memory cell array 20 (in the upper side of the chip) and the peripheral circuit region 29 in the chip 9.

The other pad/protection circuit region 3 and 1 are arranged between the other memory cell array 20 (near the lower side of the chip) and the peripheral circuit region 29 in the chip 9.

In the examples illustrated FIGS. 22 through 24, the protection circuit region 1, the pad region 3, and the memory cell array 20 and the peripheral circuit region 29 as the internal circuit 2 are provided on the chip 9 in such a manner that the regions 1, 3, 20, and 29 may extend along the longitudinal direction of the chip. However, these regions 1, 3, 20, and 29 may be provided on the chip 9 in such a manner that the regions 1, 3, 20, and 29 may extend in the width direction of the chip. In addition, the layout of the protection circuit region 1, the pad region 3, and the layout of the memory cell array 20 and the peripheral circuit region 29 as the internal circuit 2 is not limited to the examples illustrated in FIGS. 21 through 24.

The protection circuit 1 and the pad region 3 may be provided along the sides (left side and right side of the chip 9) orthogonal to the upper side and lower side of the chip, in addition to the upper side and lower side of the chip 9. In this case, the memory cell array 20 and the peripheral circuit region 29 of the semiconductor memory (internal circuit) are arranged in the chip 9 so as to be surrounded by the protection circuits 1 and the pad regions 3.

In any chip layout like the layouts illustrated in FIGS. 17 and 22 through 24, the breakdown voltage of the pad/protection region is calculated and the power supply clamp circuit included in the ESD protection circuit of the present embodiment is arranged in such a manner that the internal circuit connected to all the pads may not be destructed.

[Others]

The ESD protection circuit and the power supply circuit including the ESD protection circuit according to the present embodiment are applicable, for example, to a semiconductor memory chip such as a flash memory, a DRAM, and an SRAM, a logic circuit having a predetermined function, and an image sensor; or to a system LSI where a semiconductor memory and a logic circuit (and/or an image sensor) are provided in the same chip.

In the present embodiment, a semiconductor circuit including the ESD protection circuit is mounted to a device operating at a low power supply voltage, for example, to a mobile phone, a personal digital assistant, etc.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A power supply circuit comprising:
   a first circuit connected between a first power supply line, to which a power supply voltage is applied, and a second power supply line; and
   a power supply clamp circuit connected to the first and second power supply lines, the power supply clamp circuit including a current path circuit which connects the first power supply line and the second power supply line to each other, and a control circuit which outputs a control signal configured to control the current path circuit to the current path circuit, the current path circuit including a first transistor of a first conductivity type and a first diode group, wherein the power supply clamp circuit is driven during a period in which a first voltage is applied to the first power supply line and controls a potential of the first power supply line so as to become a potential lower than the first voltage.

2. The power supply circuit according to claim 1, wherein the current path circuit further includes a second diode, the first transistor of the first conductivity type includes an end of a current path connected to the first power supply line and a gate connected to an output terminal of the control circuit, the first diode group includes an anode connected to the other end of the current path of the first transistor and a cathode connected to the second power supply line, the first diode group includes one or more diodes connected in series according to a magnitude of the power supply voltage, and the second diode includes a cathode connected to the other end of the current path of the first transistor and an anode connected to the second power supply line.

3. The power supply circuit according to claim 1, wherein when an ESD Pulse as the first voltage occurs, the control circuit is driven by a voltage which is generated by the ESD pulse and supplies a control signal which turns on the first transistor to the current path circuit.

4. The power supply circuit according to claim 1, wherein when an ESD pulse as the first voltage occurs, when the ESD pulse is applied to the anode of the first diode group via the first transistor being in ON state, and when the anode of the first diode group becomes a predetermined voltage or higher, the first diode group is turned on.

5. The power supply circuit according to claim 1, wherein when the power supply voltage is applied to the first power supply line, when the power supply voltage is applied to the anode of the first diode group via the first transistor being in ON state, and when the anode of the first diode group is equal to or lower than a certain voltage, the first diode group is turned off.

6. The power supply circuit according to claim 1, wherein the control circuit includes a delay circuit connected between the first power supply line and the second power supply line, an inverter circuit including a first input node and a first output node, the first input node is connected to the delay circuit, and the first output node is connected to a first gate of the first transistor.

7. The power supply circuit according to claim 6, wherein when an ESD pulse as the first voltage occurs, the delay circuit outputs a delay signal configured to delay the ESD pulse to the inverter circuit, and the inverter circuit generates the control signal based on the delay signal.

8. The power supply circuit according to claim 6, wherein the delay circuit includes a first resistor element having a first terminal and a second terminal and a first capacitor element having a third terminal and a fourth terminal.

9. The power supply circuit according to claim 8, wherein the first terminal of the first resistor element is connected to the first power supply line, the second terminal of the first resistor element is connected to a first node, the third terminal of the first capacitor element is connected to the first node, and the fourth terminal of the first capacitor element is connected to the second power supply line.

10. The power supply circuit according to claim 6, wherein the inverter circuit includes a plurality of inverters connected in series, among the inverters, an inverter of a last stage includes a second transistor of the first conductivity type having one end of a second current path connected to the first power supply line and a second gate, a second resistor element having a fifth terminal connected to the other end of the second current path of the second transistor and a sixth terminal, a third transistor of a second conductivity type different from the first conductivity type, having one end of a third current path connected to the sixth terminal of the second resistor element, the other end of the third transistor connected to the second power supply line, and a third gate connected to the second gate.

11. The power supply circuit according to claim 10, wherein a connection point of the sixth terminal of the second resistor element and the one end of the third current path of the third transistor is the first output node of the inverter circuit and is connected to a gate of the first transistor.

12. The power supply circuit according to claim 10, wherein a current drive capability of the second transistor is smaller than a current drive capability of the third transistor.

13. The power supply circuit according to claim 1, wherein the control circuit includes a third resistor element having a seventh terminal and an eighth terminal and a second capacitor element having a ninth terminal and a tenth terminal.

14. The power supply circuit according to claim 13, wherein the seventh terminal of the third resistor element is connected to the first power supply line, the eighth terminal of the third resistor element is connected to a second node, the ninth terminal of the second capacitor element is connected to the second node, the tenth terminal of the second capacitor element is connected to the second power supply line, and a gate of the first transistor is connected to the second node.

15. The power supply circuit according to claim 13, wherein when, an ESD pulse as the first voltage occurs, the delay circuit outputs a delay signal of the ESD pulse to the current path circuit as the control signal.

16. The power supply circuit according to claim 1, wherein the current path circuit includes a second diode in which an anode is connected the second power supply line, and in which a cathode is connected to the first power supply line.

17. The power supply circuit according to claim 1, wherein the semiconductor circuit is a magnetic memory including a magnetoresistance effect element as a memory element.

18. A protection circuit comprising:

a first circuit including a protective element configured to protect a semiconductor circuit connected to a first power supply line to which a power supply voltage is applied and a second power supply line from an ESD pulse; and a power supply clamp circuit connected to the first power supply line and the second power supply line, the power supply clamp circuit including a current path circuit that sends the ESD pulse from the first power supply line to the second power supply line when the ESD pulse occurs, and a control circuit that outputs a control signal configured to control the current path circuit to the current path circuit, the current path circuit including a first transistor of a first conductivity type and a first diode group, wherein the power supply clamp circuit is driven during a period in which the ESD pulse is applied to the first power supply line and discharges the ESD pulse from the first power supply line to the second power supply line.

* * * * *

UNITED STATES PATENT AND TRADEMARK OFFICE
CERTIFICATE OF CORRECTION

PATENT NO. : 9,058,886 B2  
APPLICATION NO. : 13/966151  
DATED : June 16, 2015  
INVENTOR(S) : Tadashi Miyakawa Page 1 of 1

It is certified that error appears in the above-identified patent and that said Letters Patent is hereby corrected as shown below:

On the Title page; Under Related U.S. Application Data, Item (60), line 2:

change "22,113" to --22, 2013--.

Signed and Sealed this
First Day of December, 2015

Michelle K. Lee
*Director of the United States Patent and Trademark Office*